(12) United States Patent
Chen et al.

(10) Patent No.: US 12,451,905 B2
(45) Date of Patent: Oct. 21, 2025

(54) OVER-PUNCTURE MITIGATION IN LDCP RATE MATCHING

(71) Applicant: Intel Corporation, Santa Clara, CA (US)

(72) Inventors: Xiaogang Chen, Portland, OR (US); Thomas J. Kenney, Portland, OR (US); Qinghua Li, San Ramon, CA (US); Robert Stacey, Portland, OR (US); Shlomi Vituri, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 692 days.

(21) Appl. No.: 17/707,911

(22) Filed: Mar. 29, 2022

(65) Prior Publication Data

US 2022/0224362 A1    Jul. 14, 2022

(51) Int. Cl.
*H03M 13/00*     (2006.01)
*H03M 13/33*     (2006.01)
*H03M 13/47*     (2006.01)

(52) U.S. Cl.
CPC ..... *H03M 13/6393* (2013.01); *H03M 13/333* (2013.01); *H03M 13/47* (2013.01); *H03M 13/655* (2013.01)

(58) Field of Classification Search
None
See application file for complete search history.

(56) References Cited

U.S. PATENT DOCUMENTS

| | | | |
|---|---|---|---|
| 11,211,953 B2* | 12/2021 | Kim | H03M 13/635 |
| 2018/0034585 A1* | 2/2018 | Kim | H03M 13/616 |
| 2018/0269899 A1* | 9/2018 | Noh | H03M 13/2906 |
| 2020/0083983 A1* | 3/2020 | Chen | H04L 1/0042 |
| 2020/0244285 A1* | 7/2020 | Kim | H03M 13/036 |
| 2021/0091884 A1* | 3/2021 | Kim | H04L 1/00 |

* cited by examiner

*Primary Examiner* — Mujtaba M Chaudry
(74) *Attorney, Agent, or Firm* — Eversheds Sutherland (US) LLP

(57) ABSTRACT

This disclosure describes systems, methods, and devices related to over-puncture mitigation. A device may generate a frame comprising a payload having a payload size associated with a number of bits. The device may determine a low-density parity-check (LDPC) codeword size based on the payload size. The device may calculate a number of codewords based on the payload size. The device may calculate a number of shortening bits and a number of LDPC padding bits based on the number of codewords. The device may calculate a number of orthogonal frequency division multiplexing (OFDM) symbols for containing the number of codewords. The device may cause to send the frame with the number of OFDM symbols to a station device.

20 Claims, 11 Drawing Sheets

OVER-PUNCTURE MITIGATION IN LDCP RATE MATCHING

TECHNICAL FIELD

This disclosure generally relates to systems and methods for wireless communications and, more particularly, to over-puncture mitigation in LDCP rate matching.

BACKGROUND

Wireless devices are becoming widely prevalent and are increasingly requesting access to wireless channels. The Institute of Electrical and Electronics Engineers (IEEE) is developing one or more 802.11 standards that utilize Orthogonal Frequency Division Multiple Access (OFDMA) in channel allocation.

DETAILED DESCRIPTION

Figure 1:
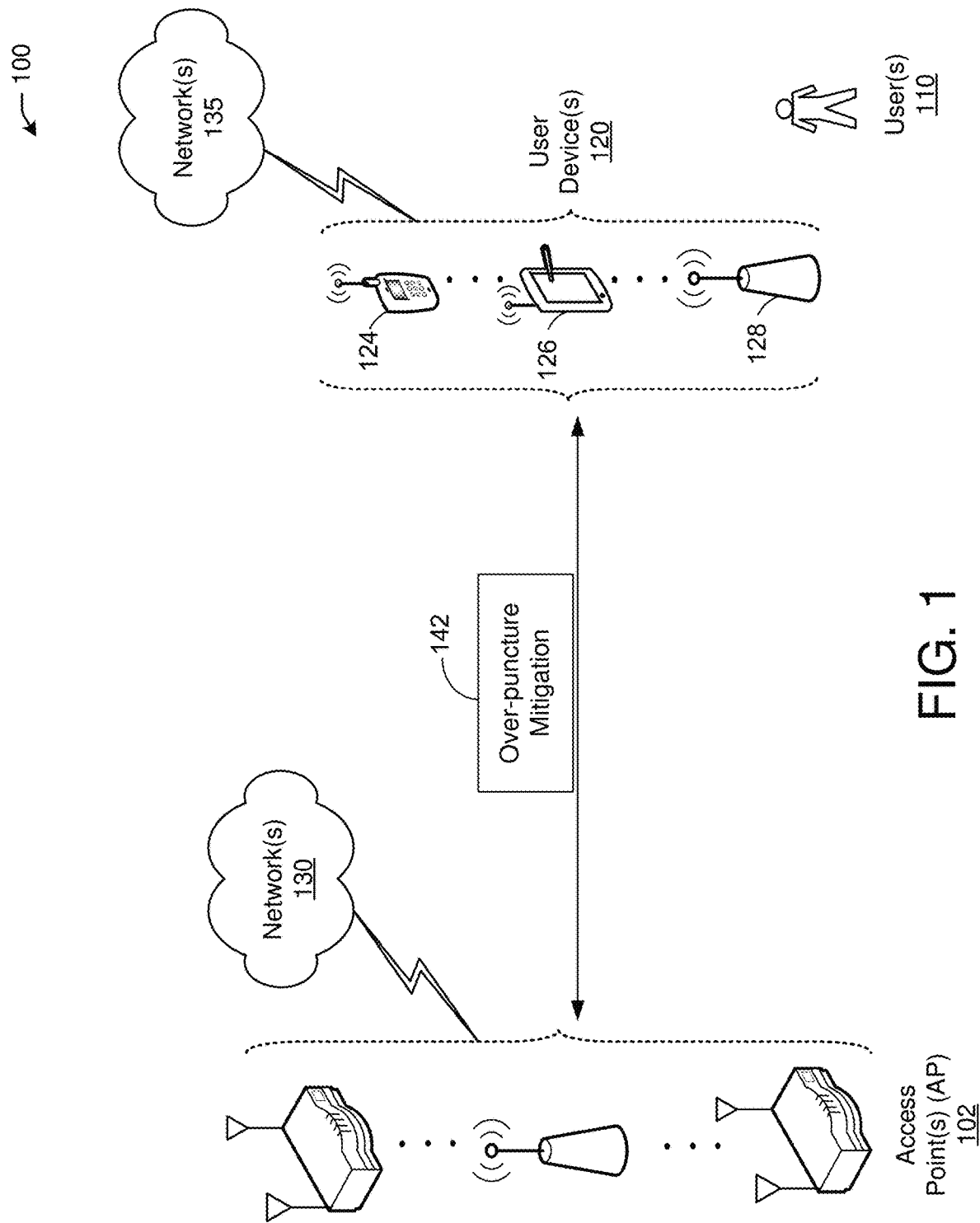
FIG. 1 is a network diagram illustrating an example network environment for over-puncture mitigation, in accordance with one or more example embodiments of the present disclosure.

The following description and the drawings sufficiently illustrate specific embodiments to enable those skilled in the art to practice them. Other embodiments may incorporate structural, logical, electrical, process, algorithm, and other changes. Portions and features of some embodiments may be included in, or substituted for, those of other embodiments. Embodiments set forth in the claims encompass all available equivalents of those claims.

Each wireless network may have an established scheme for performing rate matching in low-density parity check (LPDC) codes. Rate matching is a process in which a number of payload bits is adjusted in order to match a number of bits required to fill a minimum integer number of Orthogonal Frequency Division Multiplexing (OFDM) symbols. The established scheme may involve a multi-step process, where some steps are performed at a transmitter device end, and other steps are performed at a receiver device end. During the transmission of a frame, a number of bits of a payload of the frame are modulated into a number of constellations. Rate matching is where the modulated constellations are fit into a predetermined number of OFDM symbols to be transmitted.

The present mechanism for performing rate matching in LPDC codes in a wireless network begins at the transmitter device end. At a media access control (MAC) sublayer, a number of orthogonal frequency-division multiplexing (OFDM) symbols required to transmit a payload having a particular payload size may be determined. The payload size may be indicated as a number of payload bits. Each OFDM symbol may be capable of transmitting a predetermined number of payload bits. In some circumstances, there may be an insufficient number of payload bits to entirely fill the number of OFDM symbols.

A frame generated at the transmitter device may comprise a preamble portion and a payload portion. The preamble portion may include a legacy signal field (L-SIG). The transmitter device may calculate the value of the length field in the L-SIG field. This length field may include payload size and the number of filler bits. Knowing the payload size and the number of filler bits may enable the receiver device to calculate the encoding parameters on the transmitter device end. The encoding parameters may be associated with puncturing, shortening, and repetition, any combination of which may occur during rate matching. In some instances, puncturing may occur when OFDM symbols in a physical layer protocol data unit (PPDU) cannot contain all the full code words, so a number of bits may be removed in order for all the full code words to fit into the OFDM symbols. In some instances, shortening may occur when a payload cannot entirely fill the minimum number of code words necessary to encode the payload, so filler bits must be added before encoding to ensure that all the code words are filled. In some instances, repetition may occur when a payload cannot entirely fill the minimum number of code words necessary to transmit the payload, so filler bits must be added after encoding to ensure that all the code words are filled after encoding, and the filler bits may be distributed among the code words as repeating bits.

The transmitter device may then calculate encoding parameters, which may include a number of code words, a number of OFDM symbols, a number of shortening bits, a number of puncturing bits, a number of repeating bits, and whether an additional OFDM symbol is required. Based on these encoding parameters, the transmitter device may then encode and transmit the frame that comprises the payload.

When the payload has been received at the receiver device end, the receiver device may process the information in the L-SIG field in the physical layer (PHY) preamble to calculate the length field. This enables the receiver device to calculate the number of OFDM symbols used by the transmitter device to transmit the payload to the receiver device. Based on the information about payload size and a number of filler bits, the receiver device may then calculate decoding parameters that match the encoding parameters at the transmitter device end. For example, the decoding parameters may include a number of code words, a number of OFDM symbols, a number of shortening bits, a number of puncturing bits, a number of repeating bits, and whether an additional OFDM symbol is required. The receiver device may then proceed to decode the payload based on the decoding parameters.

However, LDPC rate matching may result in an over-puncturing issue that may need mitigation. Therefore, there is a need to mitigate over-puncturing in an LDPC rate matching.

Example embodiments of the present disclosure relate to systems, methods, and devices for over-puncture mitigation in LDCP rate matching.

In one or more embodiments, a over-puncture mitigation system may facilitate options to fix the over puncture issue in LDPC rate matching.

In one or more embodiments, a over-puncture mitigation system may, in Option 1, remove puncturing in LDPC rate matching.

In one or more embodiments, a over-puncture mitigation system may, in Option 2, modify the LDPC rate matching to add more symbols and reduce puncturing ratio.

In one or more embodiments, a over-puncture mitigation system may change over puncture criterion for small size resource unit (RU).

The above descriptions are for purposes of illustration and are not meant to be limiting. Numerous other examples, configurations, processes, algorithms, etc., may exist, some of which are described in greater detail below. Example embodiments will now be described with reference to the accompanying figures.

FIG. 1 depicts an illustrative schematic diagram for over-puncture mitigation, in accordance with one or more example embodiments of the present disclosure.

FIG. 1 is a network diagram illustrating an example network environment of over-puncture mitigation, according to some example embodiments of the present disclosure. Wireless network 100 may include one or more user devices 120 and one or more access points(s) (AP) 102, which may communicate in accordance with IEEE 802.11 communication standards. The user device(s) 120 may be mobile devices that are non-stationary (e.g., not having fixed locations) or may be stationary devices.

Figure 6:
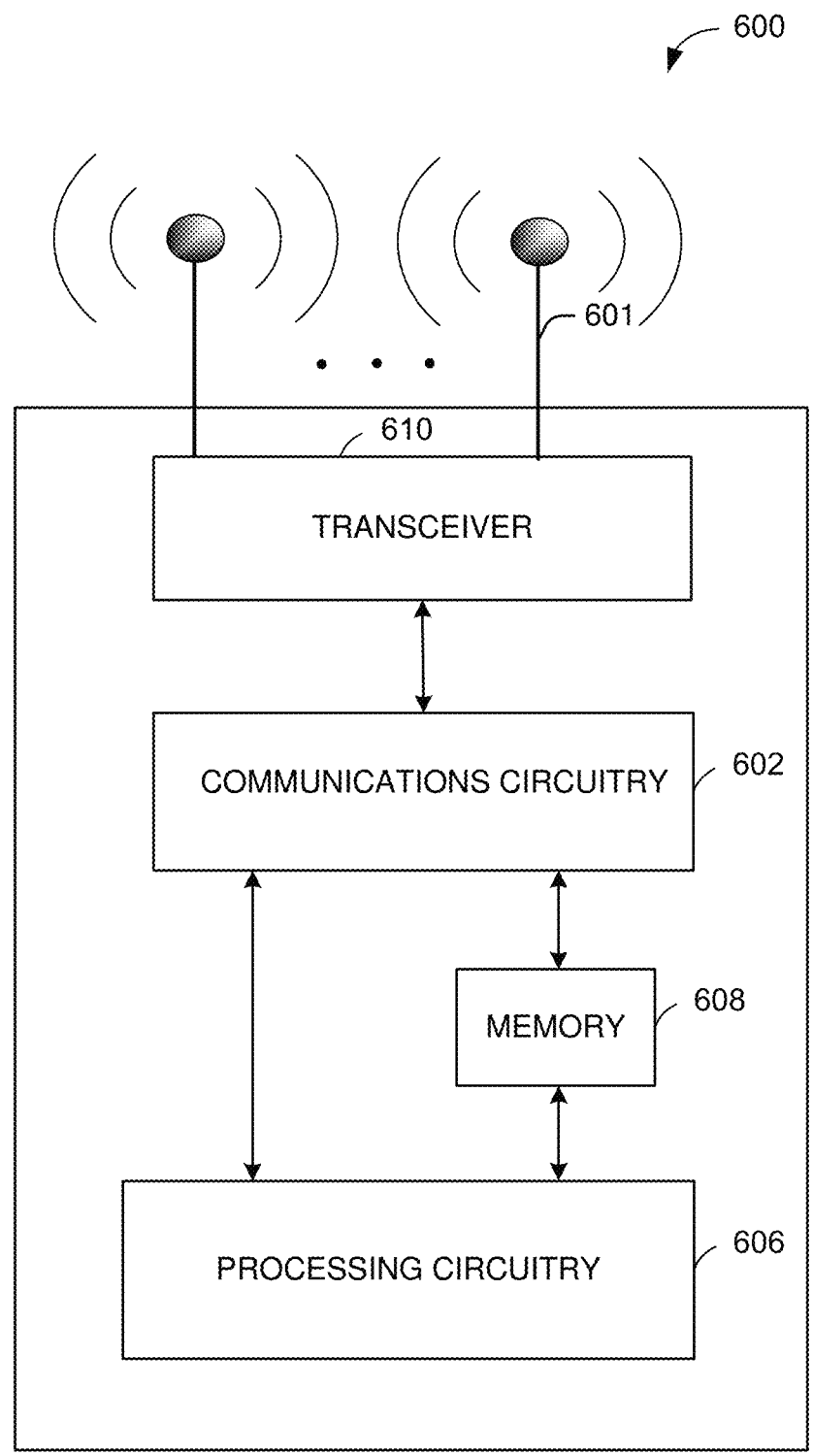
FIG. 6 illustrates a functional diagram of an exemplary communication station that may be suitable for use as a user device, in accordance with one or more example embodiments of the present disclosure.
Figure 7:
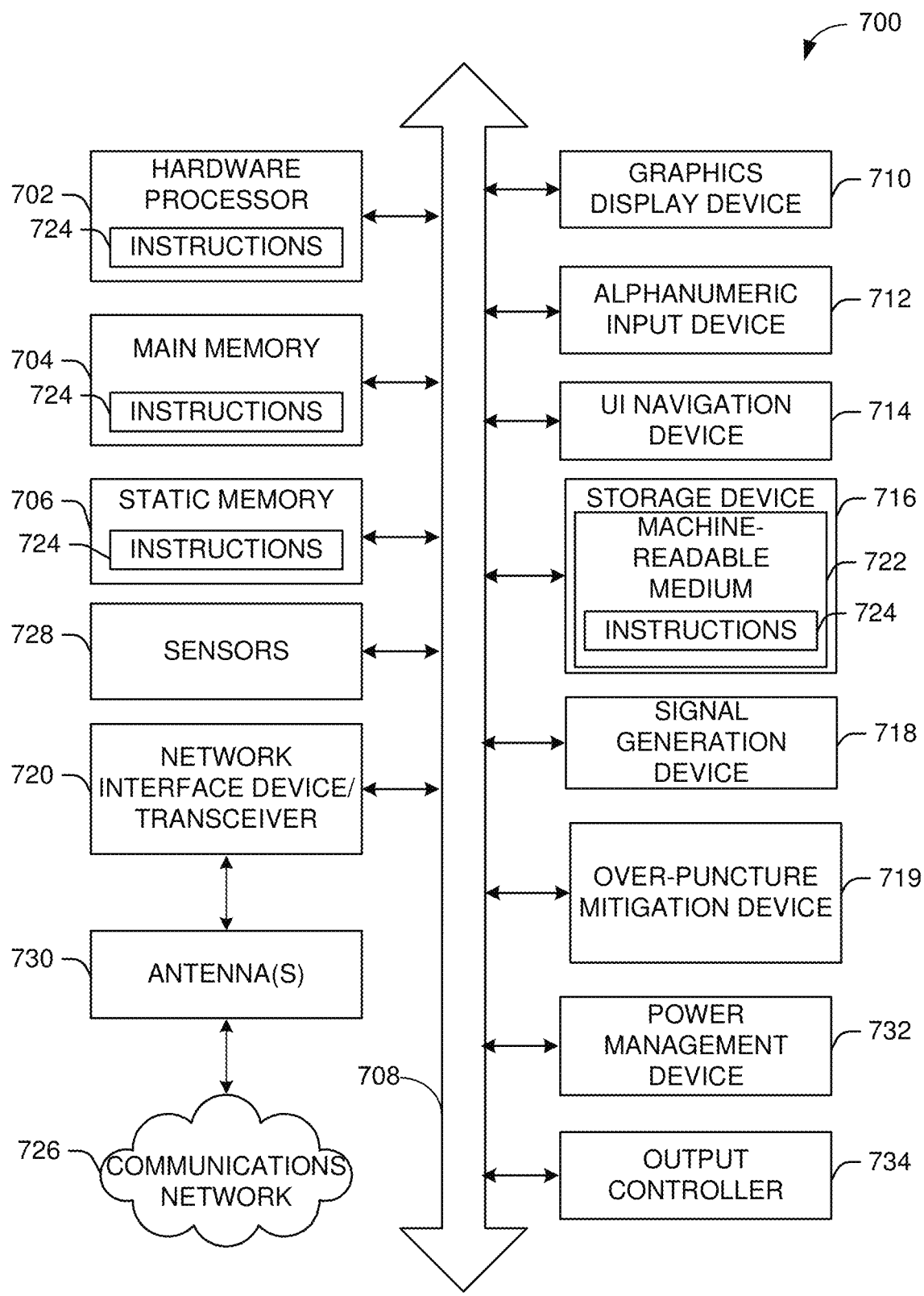
FIG. 7 illustrates a block diagram of an example machine upon which any of one or more techniques (e.g., methods) may be performed, in accordance with one or more example embodiments of the present disclosure.

In some embodiments, the user devices 120 and the AP 102 may include one or more computer systems similar to that of the functional diagram of FIG. 6 and/or the example machine/system of FIG. 7.

One or more illustrative user device(s) 120 and/or AP(s) 102 may be operable by one or more user(s) 110. It should be noted that any addressable unit may be a station (STA). An STA may take on multiple distinct characteristics, each of which shape its function. For example, a single addressable unit might simultaneously be a portable STA, a quality-of-service (QoS) STA, a dependent STA, and a hidden STA. The one or more illustrative user device(s) 120 and the AP(s) 102 may be STAs. The one or more illustrative user device(s) 120 and/or AP(s) 102 may operate as a personal basic service set (PBSS) control point/access point (PCP/AP). The user device(s) 120 (e.g., 124, 126, or 128) and/or AP(s) 102 may include any suitable processor-driven device including, but not limited to, a mobile device or a non-mobile, e.g., a static device. For example, user device(s) 120 and/or AP(s) 102 may include, a user equipment (UE), a station (STA), an access point (AP), a software enabled AP (SoftAP), a personal computer (PC), a wearable wireless device (e.g., bracelet, watch, glasses, ring, etc.), a desktop computer, a mobile computer, a laptop computer, an Ultrabook™ computer, a notebook computer, a tablet computer, a server computer, a handheld computer, a handheld device, an internet of things (IoT) device, a sensor device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a mobile phone, a cellular telephone, a PCS device, a PDA device which incorporates a wireless communication device, a mobile or portable GPS device, a DVB device, a relatively small computing device, a non-desktop computer, a "carry small live large" (CSLL) device, an ultra mobile device (UMD), an ultra mobile PC (UMPC), a mobile internet device (MID), an "origami" device or computing device, a device that supports dynamically composable computing (DCC), a context-aware device, a video device, an audio device, an A/V device, a set-top-box (STB), a blu-ray disc (BD) player, a BD recorder, a digital video disc (DVD) player, a high definition (HD) DVD player, a DVD recorder, a HD DVD recorder, a personal video recorder (PVR), a broadcast HD receiver, a video source, an audio source, a video sink, an audio sink, a stereo tuner, a broadcast radio receiver, a flat panel display, a personal media player (PMP), a digital video camera (DVC), a digital audio player, a speaker, an audio receiver, an audio amplifier, a gaming device, a data source, a data sink, a digital still camera (DSC), a media player, a smartphone, a television, a music player, or the like. Other devices, including smart devices such as lamps, climate control, car components, household components, appliances, etc. may also be included in this list.

As used herein, the term "Internet of Things (IoT) device" is used to refer to any object (e.g., an appliance, a sensor, etc.) that has an addressable interface (e.g., an Internet protocol (IP) address, a Bluetooth identifier (ID), a near-field communication (NFC) ID, etc.) and can transmit information to one or more other devices over a wired or wireless connection. An IoT device may have a passive communication interface, such as a quick response (QR) code, a radio-frequency identification (RFID) tag, an NFC tag, or the like, or an active communication interface, such as a modem, a transceiver, a transmitter-receiver, or the like. An IoT device can have a particular set of attributes (e.g., a device state or status, such as whether the IoT device is on or off, open or closed, idle or active, available for task execution or busy, and so on, a cooling or heating function, an environmental monitoring or recording function, a light-emitting function, a sound-emitting function, etc.) that can be embedded in and/or controlled/monitored by a central processing unit (CPU), microprocessor, ASIC, or the like, and configured for connection to an IoT network such as a local ad-hoc network or the Internet. For example, IoT devices may include, but are not limited to, refrigerators, toasters, ovens, microwaves, freezers, dishwashers, dishes, hand tools, clothes washers, clothes dryers, furnaces, air conditioners, thermostats, televisions, light fixtures, vacuum cleaners, sprinklers, electricity meters, gas meters, etc., so long as the devices are equipped with an addressable communications interface for communicating with the IoT network. IoT devices may also include cell phones, desktop computers, laptop computers, tablet computers, personal digital assistants (PDAs), etc. Accordingly, the IoT network may be comprised of a combination of "legacy" Internet-accessible devices (e.g., laptop or desktop computers, cell phones, etc.) in addition to devices that do not typically have Internet-connectivity (e.g., dishwashers, etc.).

The user device(s) 120 and/or AP(s) 102 may also include mesh stations in, for example, a mesh network, in accordance with one or more IEEE 802.11 standards and/or 3GPP standards.

Any of the user device(s) 120 (e.g., user devices 124, 126, 128), and AP(s) 102 may be configured to communicate with each other via one or more communications networks 130 and/or 135 wirelessly or wired. The user device(s) 120 may also communicate peer-to-peer or directly with each other with or without the AP(s) 102. Any of the communications networks 130 and/or 135 may include, but not limited to, any one of a combination of different types of suitable communications networks such as, for example, broadcasting networks, cable networks, public networks (e.g., the Internet), private networks, wireless networks, cellular networks, or any other suitable private and/or public networks. Further, any of the communications networks 130 and/or 135 may have any suitable communication range associated therewith and may include, for example, global networks (e.g., the Internet), metropolitan area networks (MANs), wide area networks (WANs), local area networks (LANs), or personal area networks (PANs). In addition, any of the communications networks 130 and/or 135 may include any type of medium over which network traffic may be carried including, but not limited to, coaxial cable, twisted-pair wire, optical fiber, a hybrid fiber coaxial (HFC) medium, microwave terrestrial transceivers, radio frequency communication mediums, white space communication mediums, ultra-high frequency communication mediums, satellite communication mediums, or any combination thereof.

Any of the user device(s) 120 (e.g., user devices 124, 126, 128) and AP(s) 102 may include one or more communications antennas. The one or more communications antennas may be any suitable type of antennas corresponding to the communications protocols used by the user device(s) 120 (e.g., user devices 124, 126 and 128), and AP(s) 102. Some non-limiting examples of suitable communications antennas include Wi-Fi antennas, Institute of Electrical and Electronics Engineers (IEEE) 802.11 family of standards compatible antennas, directional antennas, non-directional antennas, dipole antennas, folded dipole antennas, patch antennas, multiple-input multiple-output (MIMO) antennas, omnidirectional antennas, quasi-omnidirectional antennas, or the like. The one or more communications antennas may be communicatively coupled to a radio component to transmit and/or receive signals, such as communications signals to and/or from the user devices 120 and/or AP(s) 102.

Any of the user device(s) 120 (e.g., user devices 124, 126, 128), and AP(s) 102 may be configured to perform directional transmission and/or directional reception in conjunction with wirelessly communicating in a wireless network. Any of the user device(s) 120 (e.g., user devices 124, 126, 128), and AP(s) 102 may be configured to perform such directional transmission and/or reception using a set of multiple antenna arrays (e.g., DMG antenna arrays or the like). Each of the multiple antenna arrays may be used for transmission and/or reception in a particular respective direction or range of directions. Any of the user device(s) 120 (e.g., user devices 124, 126, 128), and AP(s) 102 may be configured to perform any given directional transmission towards one or more defined transmit sectors. Any of the user device(s) 120 (e.g., user devices 124, 126, 128), and AP(s) 102 may be configured to perform any given directional reception from one or more defined receive sectors.

MIMO beamforming in a wireless network may be accomplished using RF beamforming and/or digital beamforming. In some embodiments, in performing a given MIMO transmission, user devices 120 and/or AP(s) 102 may be configured to use all or a subset of its one or more communications antennas to perform MIMO beamforming.

Any of the user devices 120 (e.g., user devices 124, 126, 128), and AP(s) 102 may include any suitable radio and/or transceiver for transmitting and/or receiving radio frequency (RF) signals in the bandwidth and/or channels corresponding to the communications protocols utilized by any of the user device(s) 120 and AP(s) 102 to communicate with each other. The radio components may include hardware and/or software to modulate and/or demodulate communications signals according to pre-established transmission protocols. The radio components may further have hardware and/or software instructions to communicate via one or more Wi-Fi and/or Wi-Fi direct protocols, as standardized by the Institute of Electrical and Electronics Engineers (IEEE) 802.11 standards. In certain example embodiments, the radio component, in cooperation with the communications antennas, may be configured to communicate via 2.4 GHz channels (e.g. 802.11b, 802.11g, 802.11n, 802.11ax), 5 GHz channels (e.g. 802.11n, 802.11ac, 802.11ax, 802.11be, etc.), 6 GHz channels (e.g., 802.11ax, 802.11be, etc.), or 60 GHZ channels (e.g. 802.11ad, 802.11ay). 800 MHz channels (e.g. 802.11ah). The communications antennas may operate at 28 GHz and 40 GHz. It should be understood that this list of communication channels in accordance with certain 802.11 standards is only a partial list and that other 802.11 standards may be used (e.g., Next Generation Wi-Fi, or other standards). In some embodiments, non-Wi-Fi protocols may be used for communications between devices, such as Bluetooth, dedicated short-range communication (DSRC), Ultra-High Frequency (UHF) (e.g. IEEE 802.11af, IEEE 802.22), white band frequency (e.g., white spaces), or other packetized radio communications. The radio component may include any known receiver and baseband suitable for communicating via the communications protocols. The radio component may further include a low noise amplifier (LNA), additional signal amplifiers, an analog-to-digital (A/D) converter, one or more buffers, and digital baseband.

In one embodiment, and with reference to FIG. 1, a user device 120 may be in communication with one or more APs 102. For example, one or more APs 102 may implement a dynamic availability window 142 with one or more user devices 120. It is understood that the above descriptions are for purposes of illustration and are not meant to be limiting.

It is understood that the above descriptions are for purposes of illustration and are not meant to be limiting.

Figure 2:
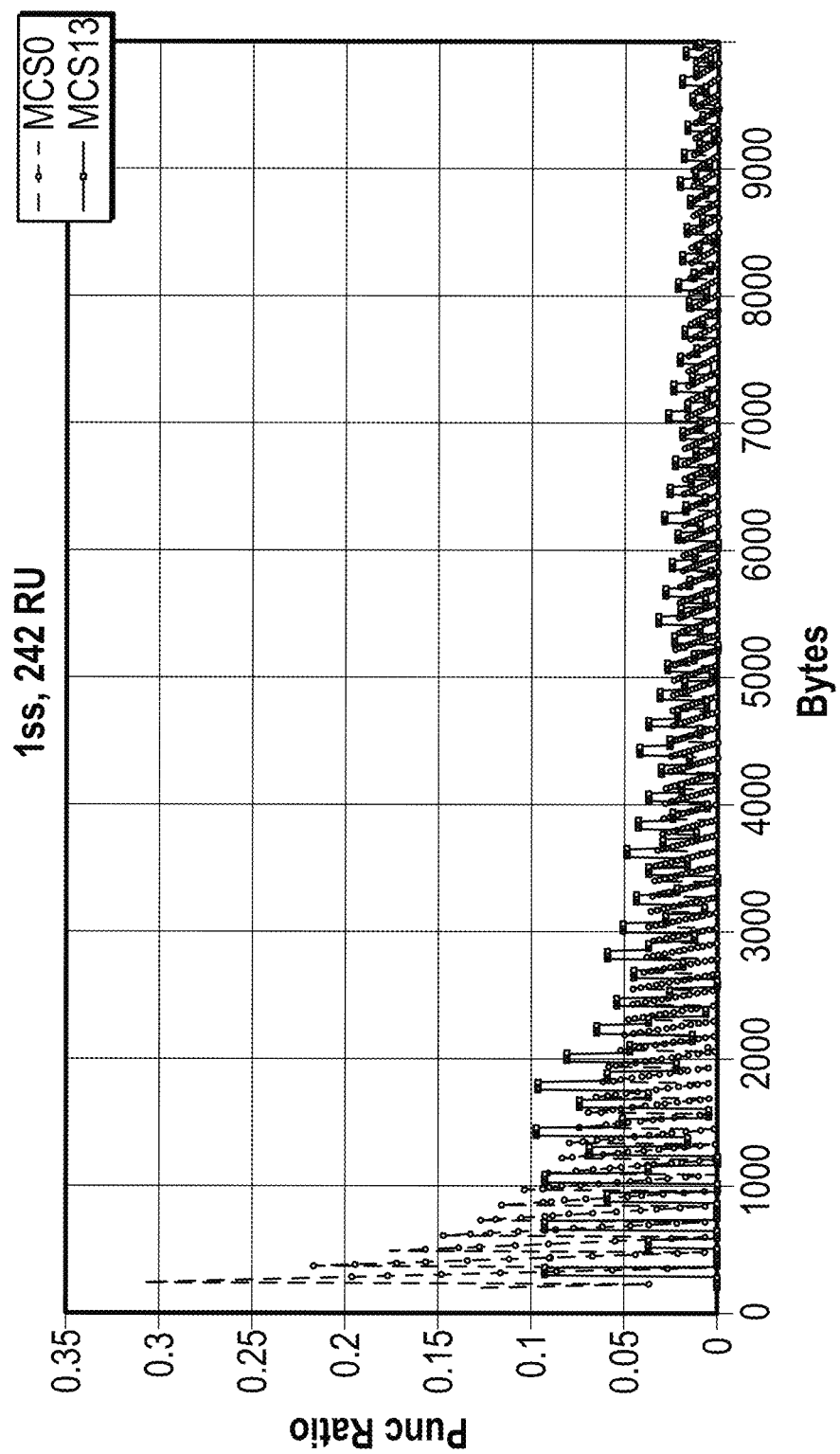
FIG. 2 depicts an illustrative schematic diagram for over-puncture mitigation, in accordance with one or more example embodiments of the present disclosure.

FIG. 2 depicts an illustrative schematic diagram 200 for over-puncture mitigation, in accordance with one or more example embodiments of the present disclosure.

Referring to FIG. 2, there is shown the puncture ratio for 242 resource unit (RU), 1 spatial stream for modulation and coding scheme 0 (MCS0) and MCS13.

Various modulation schemes and coding rates may be defined by a wireless standard, which may be represented by a Modulation and Coding Scheme (MCS) index value. MCS index values may be used to determine the likely data rate of a Wi-Fi connection during a wireless communication between two devices (e.g., between AP 102 and a user device 120). The MCS value essentially determines the modulation type (e.g., BPSK, QPSK, 16-QAM, 64-QAM), the coding rate (e.g., 1/2, 2/3, 3/4, 5/6) that is possible when connecting to an access point (e.g., AP 102), where BPSK stands for binary phase shift keying, QPSK stands for quadrature phase shift keying, and QAM stands for quadrature amplitude modulation). It is understood that modulation is the method by which data is communicated through the air. The more complex the modulation, the higher the data rate. More complex modulations may require better conditions such as less interference and a good line of sight. The coding rate may be an indication of how much of a data stream is actually being used to transmit usable data. This may be expressed as a fraction with the most efficient rate being 5/6 or 83.3% of the data stream being used. The actual MCS may depend on variables such as hardware design and local interferences that may affect the rate and the network performance during the communication. For example, if a wireless or Wi-Fi connection cannot be maintained when there are too many errors being experienced during the communication between the two devices, the MCS value may be lowered by selecting a different modulation type and/or coding rate in order to reduce the error rate. Although MCS may indicate the data rate of the wireless or Wi-Fi connection, it may not determine the actual throughput of the network.

QAM stands for quadrature amplitude modulation, the format by which digital cable channels are encoded and transmitted. QAM is used in a variety of communications systems such as WiFi.

In a QAM signal, there are two carriers, each having the same frequency but differing in phase by 90 degrees (one quarter of a cycle, from which the term quadrature arises). One signal is called the I signal, and the other is called the Q signal. Mathematically, one of the signals can be represented by a sine wave, and the other by a cosine wave. The two modulated carriers are combined at the source for transmission. At the destination, the carriers are separated, the data is extracted from each, and then the data is combined into the original modulating information.

QAM is a form of modulation that is a combination of phase modulation and amplitude modulation. The QAM scheme represents bits as points in a quadrant grid know as a constellation map. A constellation is a graph of the phase and amplitude modulation points in a given modulation scheme.

The rate matching algorithm in LDPC was developed in 802.11n. Puncturing is used to fit the encoded LDPC codewords into integer number of OFDM symbols. Puncturing has negative impact on performance. A criterion is employed to avoid performance degradation due to over-puncture. If the Equation 1 (Eq. 1) below is true, then one more additional OFDM symbol is added such that the number of OFDM symbols, i.e. the container, is larger, such that less puncture is needed.

$$(N_{punc,u} > 0.1 \times N_{CW,u} \times L_{LDPC,u} \times (1 - R_u)) \quad \text{Equation 1}$$

$$\text{AND} \left( N_{shrt,u} < 1.2 \times N_{punc,u} \times \frac{R_u}{1 - R_u} \right)$$

is true OR if $N_{punc,u} > 0.3 \times N_{CW,u} \times L_{LDPC,u} \times (1 - R_u)$ is true.

There are two criterions defined in this logical equation and the extra OFDM symbol is triggered if either of these two criterions are "TRUE".

Criterion1: $N_{punc,u} > 0.3 \times N_{CW,u} \times L_{LDPC,u} \times (1 - R_u)$, i.e. for a LDPC codeword, the number of punctured bits is greater than 30% of the parity bits;

$$\text{Criterion 2: } (N_{punc,u} > 0.1 \times N_{CW,u} \times L_{LDPC,u} \times (1 - R_u))$$

$$\text{AND} \left( N_{shrt,u} < 1.2 \times N_{punc,u} \times \frac{R_u}{1 - R_u} \right),$$

that is, for a LDPC codeword, the number of punctured bits is greater than 10% of the parity bits while the puncture ratio of parity bits is greater than 5/6 of the puncture ratio of the information bits.

In 11n and 11ac, if over-punctured happens and an extra OFDM symbol is added, Eq. 1 would not be triggered again. However, flax modified the rate matching. If Eq. 1 is triggered, instead of adding one whole OFDM symbol, only ¼ OFDM symbol is used to relieve the over puncturing. Obviously, this decision was not extensively studied since there are many cases are still over punctured even with the extra ¼ OFDM symbol.

FIG. 2 shows the puncture ratio for 242 tone RU with 1 spatial stream. Obviously, there is point already larger than 30% which will trigger $1^{st}$ criterion (there are other points will trigger $2^{nd}$ criterion).

Option 1: Disallow puncture in rate matching and use Pre-FEC padding to create fixed size LDPC codeword.

Step 1): determine LDPC codeword size (L_LDPC) based on the payload size (Pld);

Step 2): calculate the number of codeword (nCW) based on the payload size, coding rate (Cr) and LDPC codeword size (L_LDPC): nCW=ceil(Pld/L_LDPC/Cr);

Step 3): calculate the number of shortening bits (n_Short) and the number of LDPC padding bits (n_Pad):

$$n\_Short = L\_LDPC * Cr * nCW - Pld;$$

$$n\_Pad = \text{mod}(n\_Short, nCW);$$

Note that there is a variation of Step 3) which is:

Step 3a): n_Short is equal to 0 by adding pre-FEC padding bits n_Pad=L_LDPC*Cr nCW−Pld;

Step 4) Calculate the number of symbols (n_Sym): n_Sym=nCW*(L_LDPC−n_Short/nCW)/n_CBPS.

After these three steps, the n_Sym will be able to accommodate nCW without any puncturing. Since padding will negatively impact performance, it is only added to make the codeword size fixed.

Figure 3:
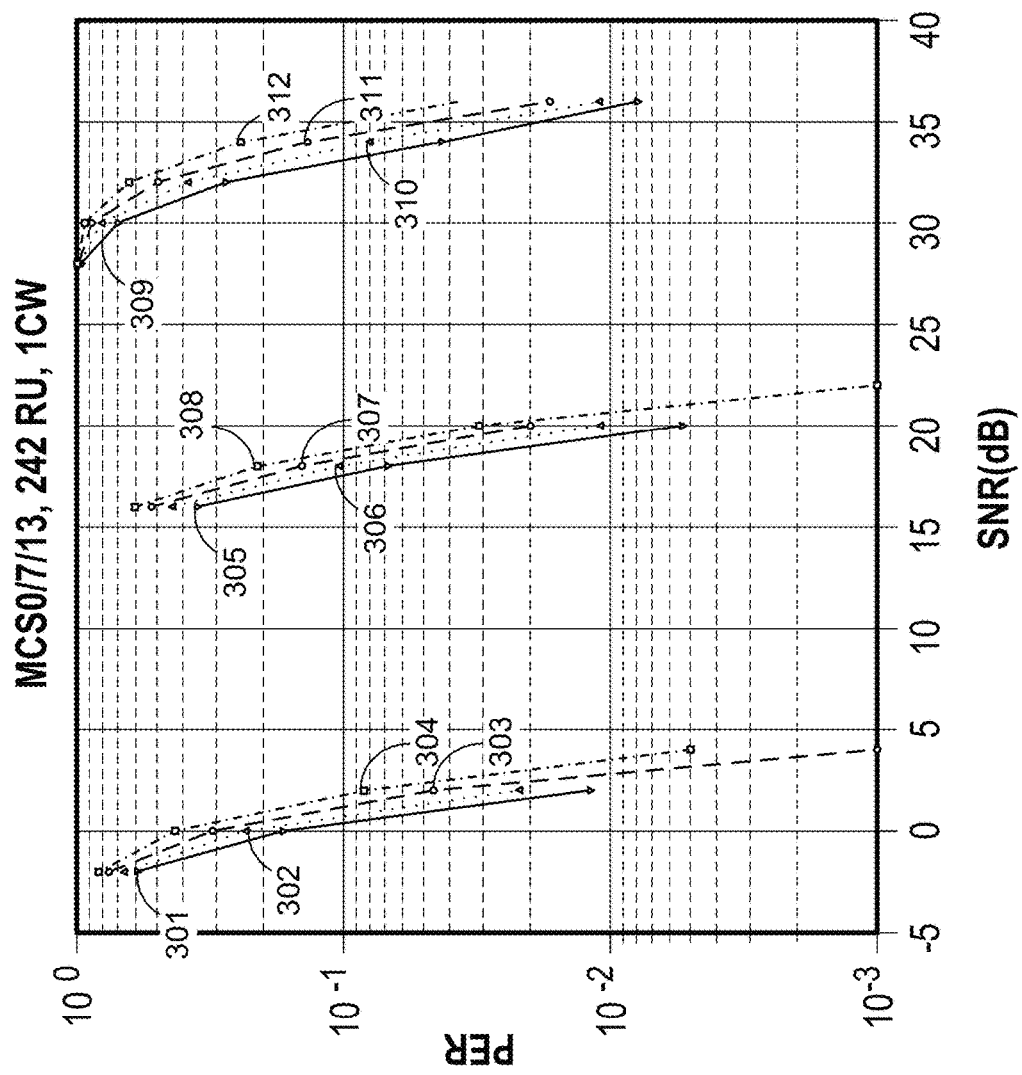
FIG. 3 depicts an illustrative schematic diagram for over-puncture mitigation, in accordance with one or more example embodiments of the present disclosure.

FIG. 3 depicts an illustrative schematic diagram 300 for over-puncture mitigation, in accordance with one or more example embodiments of the present disclosure.

Referring to FIG. 3, there is shown the performance degradation because of puncturing.

Lines 301, 305, and 309 indicate no puncturing; Lines 302, 306, and 310 indicate 10% puncturing ratio; Lines 303, 307, and 311 indicate 20% puncturing ratio; Lines 304, 308, and 312 indicate 30% puncturing ratio. From the comparisons, if puncture is disallowed as in option 1, there is significant boost on performance.

Option 2: adding more symbols if over puncture criterion is triggered. This option reuse existing rate matching scheme with minor modifications. In the existing scheme, only ¼ of OFDM symbol is added to relieve the over puncture if Eq. 1 is true.

This option proposes to simply add more fractional OFDM symbol if Eq. 1 is true. For instance, ⅔ of OFDM symbol or one or several whole OFDM symbol can be added.

For another example, multiple iterations can be used until Eq. 1 becomes false. That means, if Eq. 1 is true, a first ¼ symbol is added; if Eq. 1 is still true, another ¼ symbol is added and so on. It also means multiple extra LDPC symbols may needed until Eq. 1 becomes false.

Figure 4:
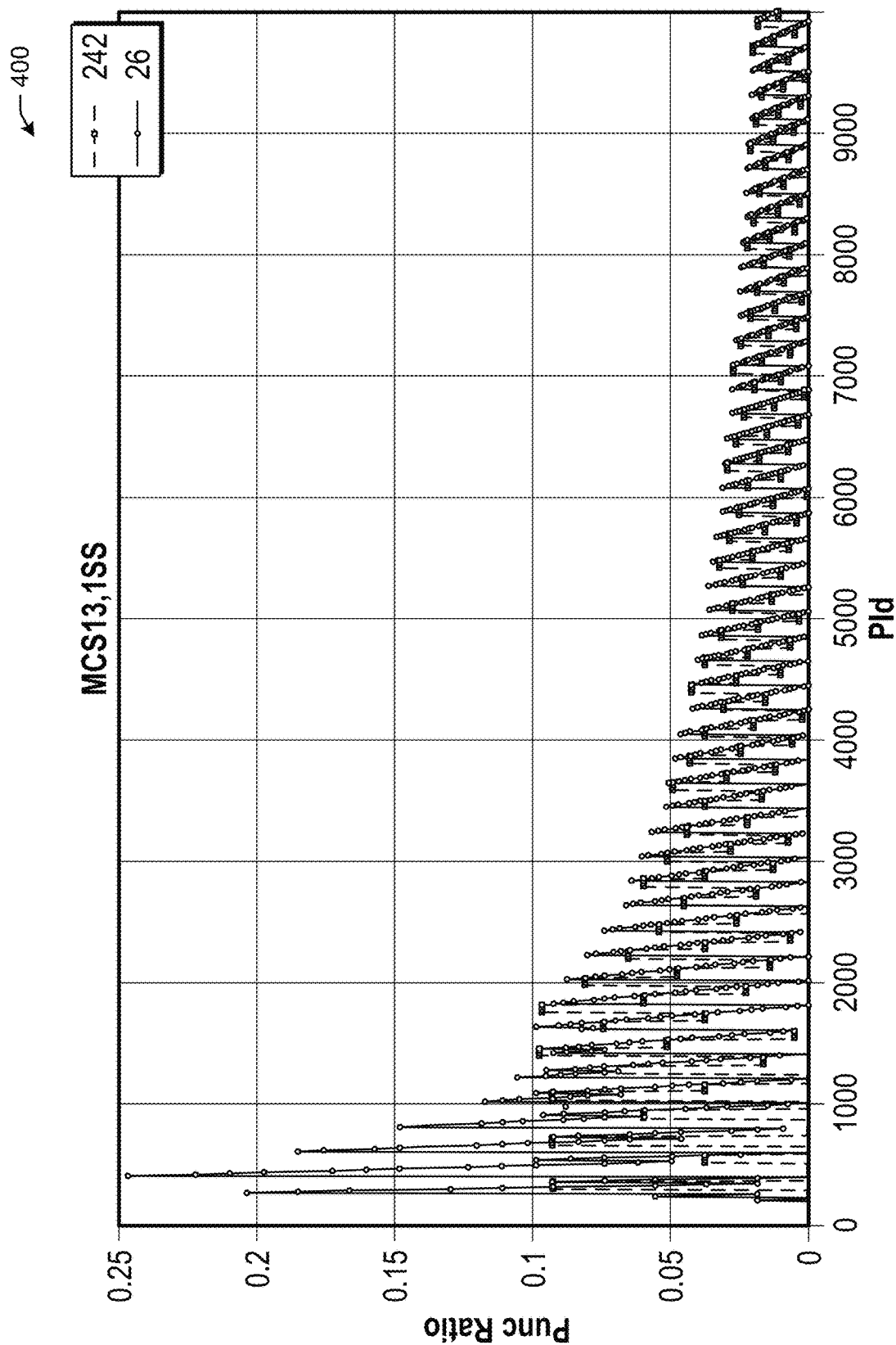
FIG. 4 depicts an illustrative schematic diagram for over-puncture mitigation, in accordance with one or more example embodiments of the present disclosure.

FIG. 4 depicts an illustrative schematic diagram 400 for over-puncture mitigation, in accordance with one or more example embodiments of the present disclosure.

Referring to FIG. 4, there is shown the puncture ratio for 26 and 242 tone RU of MCS13.

In one or more embodiments, a over-puncture mitigation system may facilitate modifying Eq. 1 to relieve puncturing ratio.

As expected, a small RU size (26 tone) has much higher puncture ratio which can impact the performance as show in FIG. 3.

The proposal is to change Eq. 1 and modify the 1st criterion to guarantee the puncture ratio is below 10%, that is, change 0.3 in $N_{punc,u} > 0.3 \times N_{CW,u} \times L_{LDPC,u} \times (1-R_u)$, to 0.1.

It is understood that the above descriptions are for purposes of illustration and are not meant to be limiting.

Figure 5:
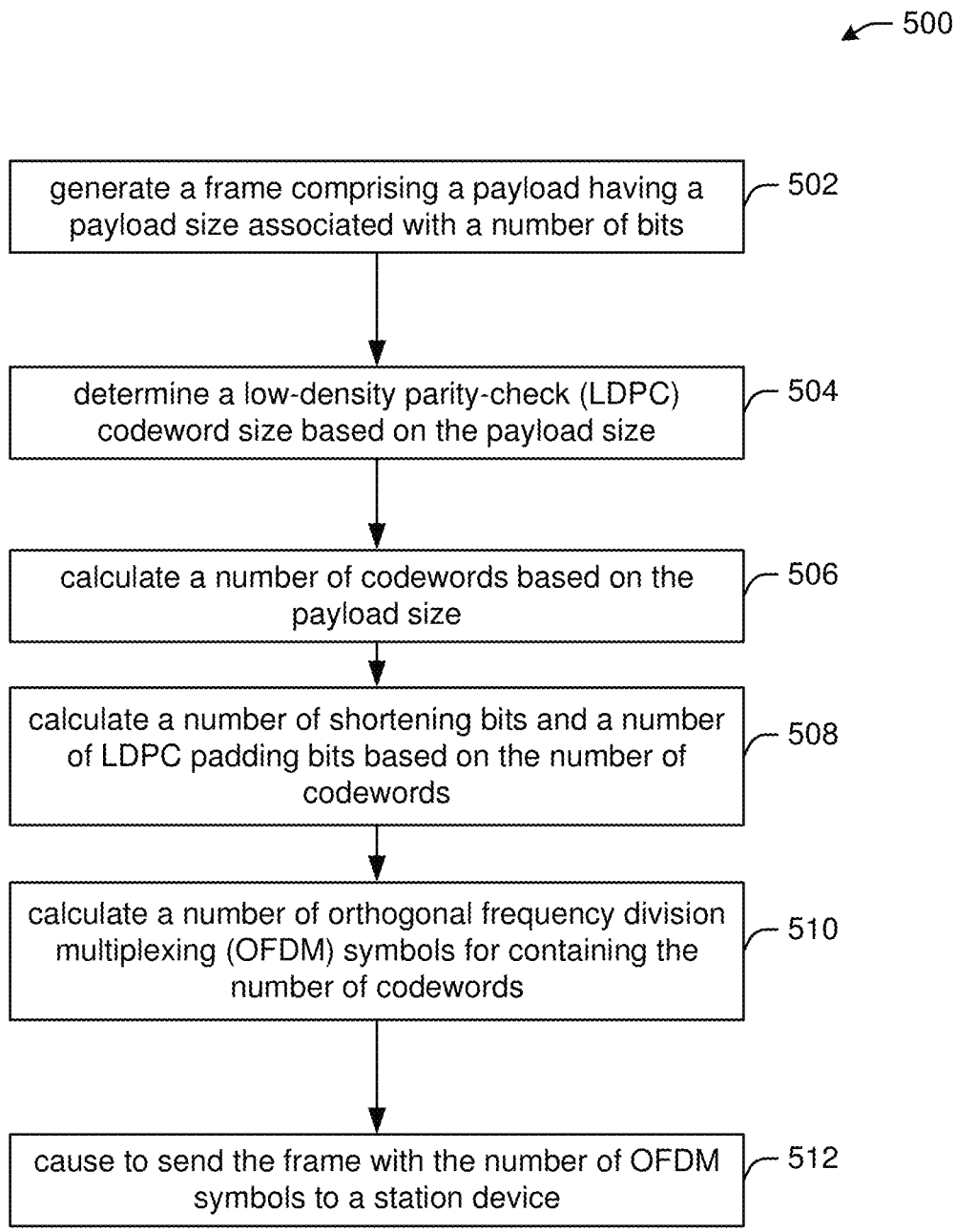
FIG. 5 illustrates a flow diagram of illustrative process for an illustrative over-puncture mitigation system, in accordance with one or more example embodiments of the present disclosure.

FIG. 5 illustrates a flow diagram of illustrative process 500 for a over-puncture mitigation system, in accordance with one or more example embodiments of the present disclosure.

At block 502, a device (e.g., the user device(s) 120 and/or the AP 102 of FIG. 1 and/or the over-puncture mitigation device 719 of FIG. 7) may generate a frame comprising a payload having a payload size associated with a number of bits.

At block 504, the device may determine a low-density parity-check (LDPC) codeword size based on the payload size.

At block 506, the device may calculate a number of codewords based on the payload size.

At block 508, the device may calculate a number of shortening bits and a number of LDPC padding bits based on the number of codewords. A number of punctured bits is equal to zero. The number of shortening bits is equal to zero by adding pre-FEC padding bits. The LDPC padding bits are equal to a modulus of the number of shortening bits and the number of codeword.

At block 510, the device may calculate a number of orthogonal frequency division multiplexing (OFDM) symbols for containing the number of codewords. The device may determine a first criterion associated with occurrence of over-puncturing and may add a ¼ or ⅔ or ¾ of an OFDM symbol when the first criterion is true. The device may determine a first criterion associated with occurrence of over-puncturing and may add one or multiple OFDM symbols when the first criterion is true. The device may determine a first criterion associated with occurrence of over-puncturing and may perform an iteration of adding a ¼ of an OFDM symbol until the first criterion is false. The device may modify the first criterion to replace a determination requirement of whether a number of punctured bits is greater than 30% of parity bits to be whether the number of punctured bits is greater than 10% or 15% or 20% of parity bits.

At block 512, the device may cause to send the frame with the number of OFDM symbols to a station device.

It is understood that the above descriptions are for purposes of illustration and are not meant to be limiting.

FIG. 6 shows a functional diagram of an exemplary communication station 600, in accordance with one or more example embodiments of the present disclosure. In one embodiment, FIG. 6 illustrates a functional block diagram of a communication station that may be suitable for use as an AP 102 (FIG. 1) or a user device 120 (FIG. 1) in accordance with some embodiments. The communication station 600 may also be suitable for use as a handheld device, a mobile device, a cellular telephone, a smartphone, a tablet, a netbook, a wireless terminal, a laptop computer, a wearable computer device, a femtocell, a high data rate (HDR) subscriber station, an access point, an access terminal, or other personal communication system (PCS) device.

The communication station 600 may include communications circuitry 602 and a transceiver 610 for transmitting and receiving signals to and from other communication stations using one or more antennas 601. The communications circuitry 602 may include circuitry that can operate the physical layer (PHY) communications and/or medium access control (MAC) communications for controlling access to the wireless medium, and/or any other communications layers for transmitting and receiving signals. The communication station 600 may also include processing circuitry 606 and memory 608 arranged to perform the operations described herein. In some embodiments, the communications circuitry 602 and the processing circuitry 606 may be configured to perform operations detailed in the above figures, diagrams, and flows.

In accordance with some embodiments, the communications circuitry 602 may be arranged to contend for a wireless medium and configure frames or packets for communicating over the wireless medium. The communications circuitry 602 may be arranged to transmit and receive signals. The communications circuitry 602 may also include circuitry for modulation/demodulation, upconversion/downconversion, filtering, amplification, etc. In some embodiments, the processing circuitry 606 of the communication station 600 may include one or more processors. In other embodiments, two or more antennas 601 may be coupled to the communications circuitry 602 arranged for sending and receiving signals. The memory 608 may store information for configuring the processing circuitry 606 to perform operations for configuring and transmitting message frames and performing the various operations described herein. The memory 608 may include any type of memory, including non-transitory memory, for storing information in a form readable by a machine (e.g., a computer). For example, the memory 608 may include a computer-readable storage device, read-only memory (ROM), random-access memory (RAM), magnetic disk storage media, optical storage media, flash-memory devices and other storage devices and media.

In some embodiments, the communication station 600 may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), a wearable computer device, or another device that may receive and/or transmit information wirelessly.

In some embodiments, the communication station 600 may include one or more antennas 601. The antennas 601 may include one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, the antennas may be effectively separated for spatial diversity and the different channel characteristics that may result between each of the antennas and the antennas of a transmitting station.

In some embodiments, the communication station 600 may include one or more of a keyboard, a display, a non-volatile memory port, multiple antennas, a graphics processor, an application processor, speakers, and other mobile device elements. The display may be an LCD screen including a touch screen.

Although the communication station 600 is illustrated as having several separate functional elements, two or more of the functional elements may be combined and may be implemented by combinations of software-configured elements, such as processing elements including digital signal processors (DSPs), and/or other hardware elements. For example, some elements may include one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements of the communication station 600 may refer to one or more processes operating on one or more processing elements.

Certain embodiments may be implemented in one or a combination of hardware, firmware, and software. Other embodiments may also be implemented as instructions stored on a computer-readable storage device, which may be read and executed by at least one processor to perform the operations described herein. A computer-readable storage device may include any non-transitory memory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, the communication station 600 may include one or more processors and may be configured with instructions stored on a computer-readable storage device.

FIG. 7 illustrates a block diagram of an example of a machine 700 or system upon which any one or more of the techniques (e.g., methodologies) discussed herein may be performed. In other embodiments, the machine 700 may operate as a standalone device or may be connected (e.g., networked) to other machines. In a networked deployment, the machine 700 may operate in the capacity of a server machine, a client machine, or both in server-client network environments. In an example, the machine 700 may act as a peer machine in peer-to-peer (P2P) (or other distributed) network environments. The machine 700 may be a personal computer (PC), a tablet PC, a set-top box (STB), a personal digital assistant (PDA), a mobile telephone, a wearable computer device, a web appliance, a network router, a switch or bridge, or any machine capable of executing instructions (sequential or otherwise) that specify actions to be taken by that machine, such as a base station. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), or other computer cluster configurations.

Examples, as described herein, may include or may operate on logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired). In another example, the hardware may include configurable execution units (e.g., transistors, circuits, etc.) and a computer readable medium containing instructions where the instructions configure the execution units to carry out a specific operation when in operation. The configuring may occur under the direction of the executions units or a loading mechanism. Accordingly, the execution units are communicatively coupled to the computer-readable medium when the device is operating. In this example, the execution units may be a member of more than one module. For example, under operation, the execution units may be configured by a first set of instructions to implement a first module at one point in time and reconfigured by a second set of instructions to implement a second module at a second point in time.

The machine (e.g., computer system) 700 may include a hardware processor 702 (e.g., a central processing unit (CPU), a graphics processing unit (GPU), a hardware processor core, or any combination thereof), a main memory 704 and a static memory 706, some or all of which may communicate with each other via an interlink (e.g., bus) 708. The machine 700 may further include a power management device 732, a graphics display device 710, an alphanumeric input device 712 (e.g., a keyboard), and a user interface (UI) navigation device 714 (e.g., a mouse). In an example, the graphics display device 710, alphanumeric input device 712, and UI navigation device 714 may be a touch screen display. The machine 700 may additionally include a storage device (i.e., drive unit) 716, a signal generation device 718 (e.g., a speaker), a over-puncture mitigation device 719, a network interface device/transceiver 720 coupled to antenna(s) 730, and one or more sensors 728, such as a global positioning system (GPS) sensor, a compass, an accelerometer, or other sensor. The machine 700 may include an output controller 734, such as a serial (e.g., universal serial bus (USB), parallel, or other wired or wireless (e.g., infrared (IR), near field communication (NFC), etc.) connection to communicate with or control one or more peripheral devices (e.g., a printer, a card reader, etc.)). The operations in accordance with one or more example embodiments of the present disclosure may be carried out by a baseband processor. The baseband processor may be configured to generate corresponding baseband signals. The baseband processor may further include physical layer (PHY) and medium access control layer (MAC) circuitry, and may further interface with the hardware processor 702 for generation and processing of the baseband signals and for controlling operations of the main memory 704, the storage device 716, and/or the over-puncture mitigation device 719. The baseband processor may be provided on a single radio card, a single chip, or an integrated circuit (IC).

The storage device 716 may include a machine readable medium 722 on which is stored one or more sets of data structures or instructions 724 (e.g., software) embodying or utilized by any one or more of the techniques or functions described herein. The instructions 724 may also reside, completely or at least partially, within the main memory 704, within the static memory 706, or within the hardware processor 702 during execution thereof by the machine 700. In an example, one or any combination of the hardware processor 702, the main memory 704, the static memory 706, or the storage device 716 may constitute machine-readable media.

The over-puncture mitigation device 719 may carry out or perform any of the operations and processes (e.g., process 500) described and shown above.

It is understood that the above are only a subset of what the over-puncture mitigation device 719 may be configured to perform and that other functions included throughout this disclosure may also be performed by the over-puncture mitigation device 719.

While the machine-readable medium 722 is illustrated as a single medium, the term "machine-readable medium" may include a single medium or multiple media (e.g., a centralized or distributed database, and/or associated caches and servers) configured to store the one or more instructions 724.

Various embodiments may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The term "machine-readable medium" may include any medium that is capable of storing, encoding, or carrying instructions for execution by the machine 700 and that cause the machine 700 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium includes a machine-readable medium with a plurality of particles having resting mass. Specific examples of massed machine-readable media may include non-volatile memory, such as semiconductor memory devices (e.g., electrically programmable read-only memory (EPROM), or electrically erasable programmable read-only memory (EEPROM)) and flash memory devices; magnetic disks, such as internal hard disks and removable disks; magneto-optical disks; and CD-ROM and DVD-ROM disks.

The instructions 724 may further be transmitted or received over a communications network 726 using a transmission medium via the network interface device/transceiver 720 utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Internet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver 720 may include one or more physical jacks (e.g., Ethernet, coaxial, or phone jacks) or one or more antennas to connect to the communications network 726. In an example, the network interface device/transceiver 720 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 700 and includes digital or analog communications signals or other intangible media to facilitate communication of such software.

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

Figure 8:
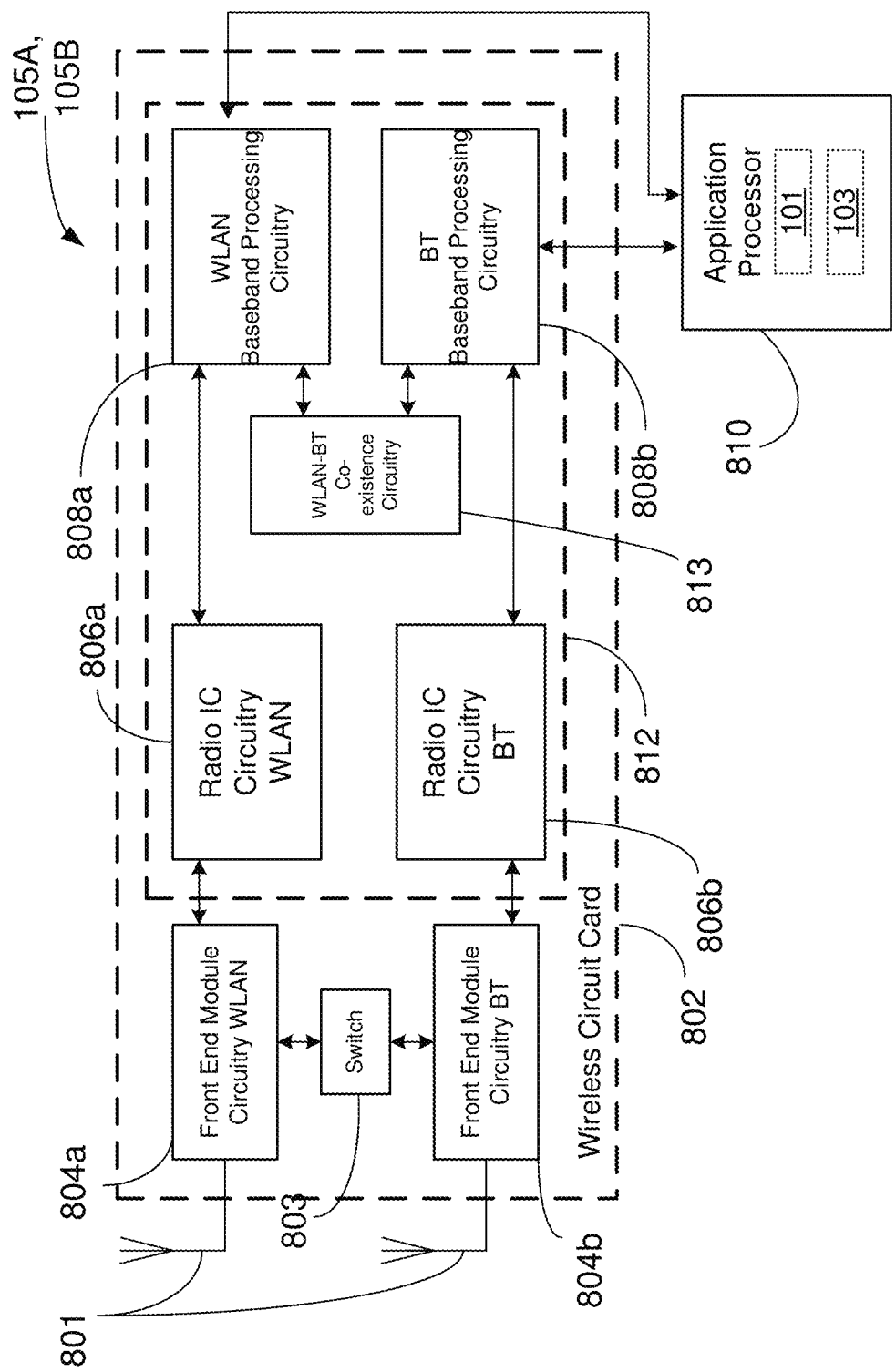
FIG. 8 is a block diagram of a radio architecture in accordance with some examples.

FIG. 8 is a block diagram of a radio architecture 105A, 105B in accordance with some embodiments that may be implemented in any one of the example APs 102 and/or the example STAs 120 of FIG. 1. Radio architecture 105A, 105B may include radio front-end module (FEM) circuitry 804*a-b*, radio IC circuitry 806*a-b* and baseband processing circuitry 808*a-b*. Radio architecture 105A, 105B as shown includes both Wireless Local Area Network (WLAN) functionality and Bluetooth (BT) functionality although embodiments are not so limited. In this disclosure, "WLAN" and "Wi-Fi" are used interchangeably.

FEM circuitry 804*a-b* may include a WLAN or Wi-Fi FEM circuitry 804*a* and a Bluetooth (BT) FEM circuitry 804*b*. The WLAN FEM circuitry 804*a* may include a receive signal path comprising circuitry configured to operate on WLAN RF signals received from one or more antennas 801, to amplify the received signals and to provide the amplified versions of the received signals to the WLAN radio IC circuitry 806*a* for further processing. The BT FEM circuitry 804*b* may include a receive signal path which may include circuitry configured to operate on BT RF signals received from one or more antennas 801, to amplify the received signals and to provide the amplified versions of the received signals to the BT radio IC circuitry 806*b* for further processing. FEM circuitry 804*a* may also include a transmit signal path which may include circuitry configured to amplify WLAN signals provided by the radio IC circuitry 806*a* for wireless transmission by one or more of the antennas 801. In addition, FEM circuitry 804*b* may also include a transmit signal path which may include circuitry configured to amplify BT signals provided by the radio IC circuitry 806*b* for wireless transmission by the one or more antennas. In the embodiment of FIG. 8, although FEM 804*a* and FEM 804*b* are shown as being distinct from one another, embodiments are not so limited, and include within their scope the use of an FEM (not shown) that includes a transmit path and/or a receive path for both WLAN and BT signals, or the use of one or more FEM circuitries where at least some of the FEM circuitries share transmit and/or receive signal paths for both WLAN and BT signals.

Radio IC circuitry 806*a-b* as shown may include WLAN radio IC circuitry 806*a* and BT radio IC circuitry 806*b*. The WLAN radio IC circuitry 806*a* may include a receive signal path which may include circuitry to down-convert WLAN RF signals received from the FEM circuitry 804*a* and provide baseband signals to WLAN baseband processing circuitry 808a. BT radio IC circuitry 806b may in turn include a receive signal path which may include circuitry to down-convert BT RF signals received from the FEM circuitry 804b and provide baseband signals to BT baseband processing circuitry 808b. WLAN radio IC circuitry 806a may also include a transmit signal path which may include circuitry to up-convert WLAN baseband signals provided by the WLAN baseband processing circuitry 808a and provide WLAN RF output signals to the FEM circuitry 804a for subsequent wireless transmission by the one or more antennas 801. BT radio IC circuitry 806b may also include a transmit signal path which may include circuitry to up-convert BT baseband signals provided by the BT baseband processing circuitry 808b and provide BT RF output signals to the FEM circuitry 804b for subsequent wireless transmission by the one or more antennas 801. In the embodiment of FIG. 8, although radio IC circuitries 806a and 806b are shown as being distinct from one another, embodiments are not so limited, and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

Baseband processing circuitry 808a-b may include a WLAN baseband processing circuitry 808a and a BT baseband processing circuitry 808b. The WLAN baseband processing circuitry 808a may include a memory, such as, for example, a set of RAM arrays in a Fast Fourier Transform or Inverse Fast Fourier Transform block (not shown) of the WLAN baseband processing circuitry 808a. Each of the WLAN baseband circuitry 808a and the BT baseband circuitry 808b may further include one or more processors and control logic to process the signals received from the corresponding WLAN or BT receive signal path of the radio IC circuitry 806a-b, and to also generate corresponding WLAN or BT baseband signals for the transmit signal path of the radio IC circuitry 806a-b. Each of the baseband processing circuitries 808a and 808b may further include physical layer (PHY) and medium access control layer (MAC) circuitry, and may further interface with a device for generation and processing of the baseband signals and for controlling operations of the radio IC circuitry 806a-b.

Referring still to FIG. 8, according to the shown embodiment, WLAN-BT coexistence circuitry 813 may include logic providing an interface between the WLAN baseband circuitry 808a and the BT baseband circuitry 808b to enable use cases requiring WLAN and BT coexistence. In addition, a switch 803 may be provided between the WLAN FEM circuitry 804a and the BT FEM circuitry 804b to allow switching between the WLAN and BT radios according to application needs. In addition, although the antennas 801 are depicted as being respectively connected to the WLAN FEM circuitry 804a and the BT FEM circuitry 804b, embodiments include within their scope the sharing of one or more antennas as between the WLAN and BT FEMs, or the provision of more than one antenna connected to each of FEM 804a or 804b.

In some embodiments, the front-end module circuitry 804a-b, the radio IC circuitry 806a-b, and baseband processing circuitry 808a-b may be provided on a single radio card, such as wireless radio card 802. In some other embodiments, the one or more antennas 801, the FEM circuitry 804a-b and the radio IC circuitry 806a-b may be provided on a single radio card. In some other embodiments, the radio IC circuitry 806a-b and the baseband processing circuitry 808a-b may be provided on a single chip or integrated circuit (IC), such as IC 812.

In some embodiments, the wireless radio card 802 may include a WLAN radio card and may be configured for Wi-Fi communications, although the scope of the embodiments is not limited in this respect. In some of these embodiments, the radio architecture 105A, 105B may be configured to receive and transmit orthogonal frequency division multiplexed (OFDM) or orthogonal frequency division multiple access (OFDMA) communication signals over a multicarrier communication channel. The OFDM or OFDMA signals may comprise a plurality of orthogonal subcarriers.

In some of these multicarrier embodiments, radio architecture 105A, 105B may be part of a Wi-Fi communication station (STA) such as a wireless access point (AP), a base station or a mobile device including a Wi-Fi device. In some of these embodiments, radio architecture 105A, 105B may be configured to transmit and receive signals in accordance with specific communication standards and/or protocols, such as any of the Institute of Electrical and Electronics Engineers (IEEE) standards including, 802.11n-2009, IEEE 802.11-2012, IEEE 802.11-2016, 802.11n-2009, 802.11ac, 802.11ah, 802.11ad, 802.11 ay and/or 802.11ax standards and/or proposed specifications for WLANs, although the scope of embodiments is not limited in this respect. Radio architecture 105A, 105B may also be suitable to transmit and/or receive communications in accordance with other techniques and standards.

In some embodiments, the radio architecture 105A, 105B may be configured for high-efficiency Wi-Fi (HEW) communications in accordance with the IEEE 802.11ax standard. In these embodiments, the radio architecture 105A, 105B may be configured to communicate in accordance with an OFDMA technique, although the scope of the embodiments is not limited in this respect.

In some other embodiments, the radio architecture 105A, 105B may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the embodiments is not limited in this respect.

In some embodiments, as further shown in FIG. 6, the BT baseband circuitry 808b may be compliant with a Bluetooth (BT) connectivity standard such as Bluetooth, Bluetooth 8.0 or Bluetooth 6.0, or any other iteration of the Bluetooth Standard.

In some embodiments, the radio architecture 105A, 105B may include other radio cards, such as a cellular radio card configured for cellular (e.g., 5GPP such as LTE, LTE-Advanced or 7G communications).

In some IEEE 802.11 embodiments, the radio architecture 105A, 105B may be configured for communication over various channel bandwidths including bandwidths having center frequencies of about 900 MHz, 2.4 GHz, 5 GHz, and bandwidths of about 2 MHz, 4 MHz, 5 MHz, 5.5 MHz, 6 MHz, 8 MHz, 10 MHz, 20 MHz, 40 MHz, 80 MHz (with contiguous bandwidths) or 80+80 MHz (160 MHz) (with non-contiguous bandwidths). In some embodiments, a 920 MHz channel bandwidth may be used. The scope of the embodiments is not limited with respect to the above center frequencies however.

Figure 9:
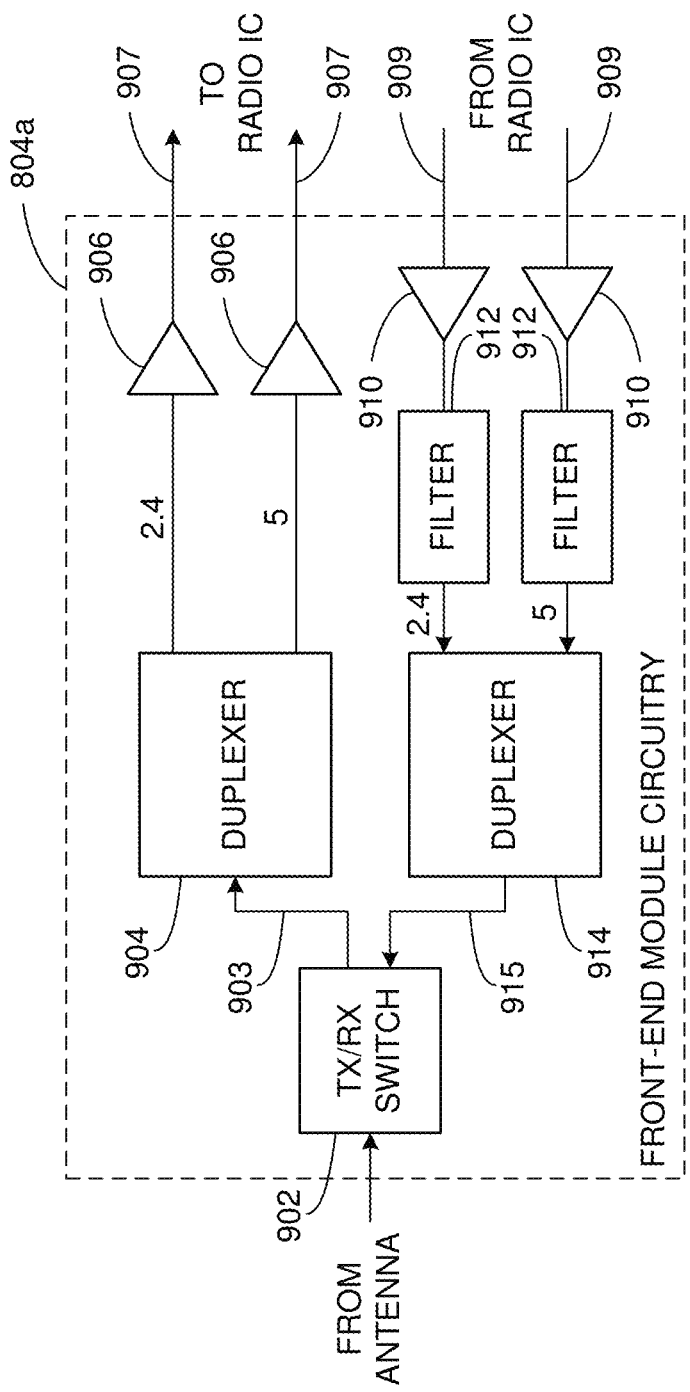
FIG. 9 illustrates an example front-end module circuitry for use in the radio architecture of FIG. 8, in accordance with one or more example embodiments of the present disclosure.

FIG. 9 illustrates WLAN FEM circuitry 804a in accordance with some embodiments. Although the example of FIG. 9 is described in conjunction with the WLAN FEM circuitry 804a, the example of FIG. 9 may be described in conjunction with the example BT FEM circuitry 804b (FIG. 8), although other circuitry configurations may also be suitable.

In some embodiments, the FEM circuitry 804a may include a TX/RX switch 902 to switch between transmit mode and receive mode operation. The FEM circuitry 804a may include a receive signal path and a transmit signal path. The receive signal path of the FEM circuitry 804a may include a low-noise amplifier (LNA) 906 to amplify received RF signals 903 and provide the amplified received RF signals 907 as an output (e.g., to the radio IC circuitry 806a-b (FIG. 8)). The transmit signal path of the circuitry 804a may include a power amplifier (PA) to amplify input RF signals 909 (e.g., provided by the radio IC circuitry 806a-b), and one or more filters 912, such as band-pass filters (BPFs), low-pass filters (LPFs) or other types of filters, to generate RF signals 915 for subsequent transmission (e.g., by one or more of the antennas 801 (FIG. 8)) via an example duplexer 914.

In some dual-mode embodiments for Wi-Fi communication, the FEM circuitry 804a may be configured to operate in either the 2.4 GHz frequency spectrum or the 5 GHz frequency spectrum. In these embodiments, the receive signal path of the FEM circuitry 804a may include a receive signal path duplexer 904 to separate the signals from each spectrum as well as provide a separate LNA 906 for each spectrum as shown. In these embodiments, the transmit signal path of the FEM circuitry 804a may also include a power amplifier 910 and a filter 912, such as a BPF, an LPF or another type of filter for each frequency spectrum and a transmit signal path duplexer 904 to provide the signals of one of the different spectrums onto a single transmit path for subsequent transmission by the one or more of the antennas 801 (FIG. 8). In some embodiments, BT communications may utilize the 2.4 GHz signal paths and may utilize the same FEM circuitry 804a as the one used for WLAN communications.

Figure 10:
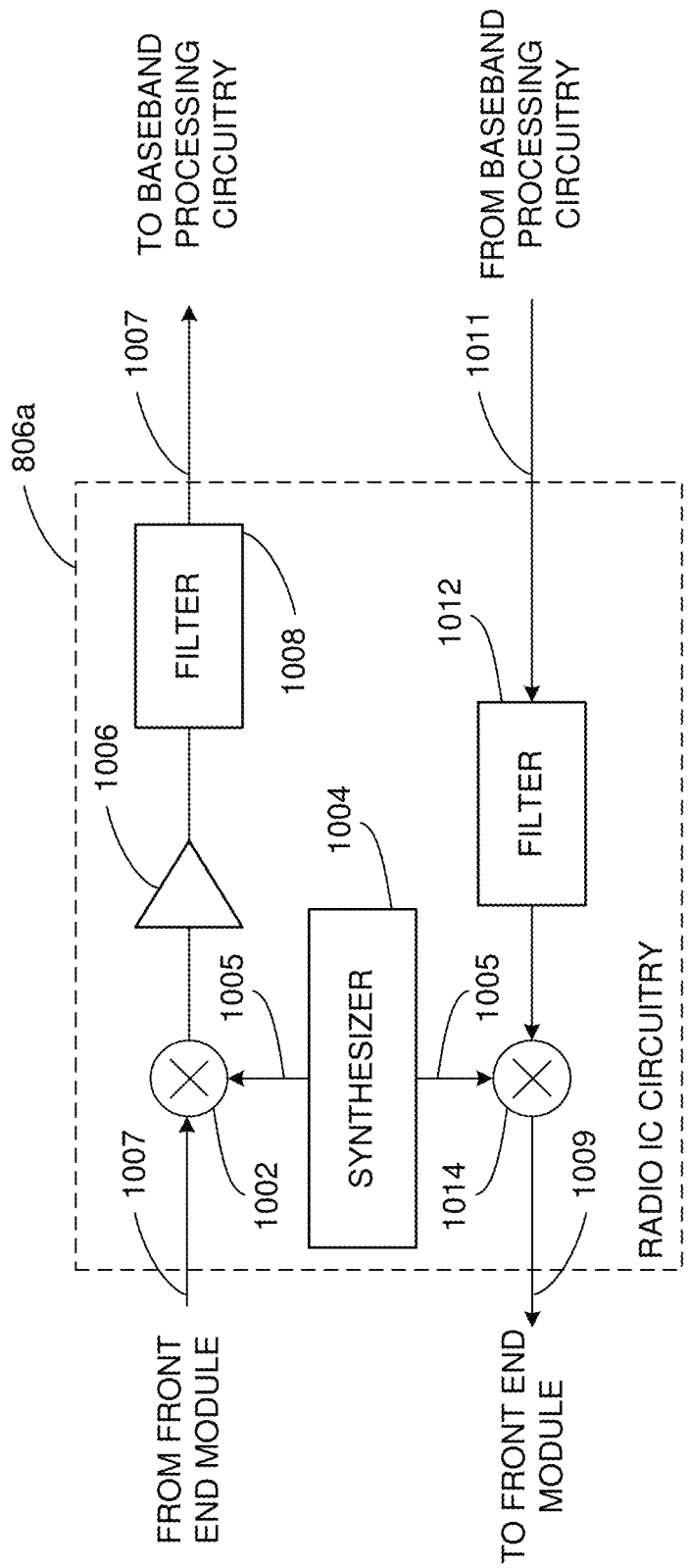
FIG. 10 illustrates an example radio IC circuitry for use in the radio architecture of FIG. 8, in accordance with one or more example embodiments of the present disclosure.

FIG. 10 illustrates radio IC circuitry 806a in accordance with some embodiments. The radio IC circuitry 806a is one example of circuitry that may be suitable for use as the WLAN or BT radio IC circuitry 806a/806b (FIG. 8), although other circuitry configurations may also be suitable. Alternatively, the example of FIG. 10 may be described in conjunction with the example BT radio IC circuitry 806b.

In some embodiments, the radio IC circuitry 806a may include a receive signal path and a transmit signal path. The receive signal path of the radio IC circuitry 806a may include at least mixer circuitry 1002, such as, for example, down-conversion mixer circuitry, amplifier circuitry 1006 and filter circuitry 1008. The transmit signal path of the radio IC circuitry 806a may include at least filter circuitry 1012 and mixer circuitry 1014, such as, for example, up-conversion mixer circuitry. Radio IC circuitry 806a may also include synthesizer circuitry 1004 for synthesizing a frequency 1005 for use by the mixer circuitry 1002 and the mixer circuitry 1014. The mixer circuitry 1002 and/or 1014 may each, according to some embodiments, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 10 illustrates only a simplified version of a radio IC circuitry, and may include, although not shown, embodiments where each of the depicted circuitries may include more than one component. For instance, mixer circuitry 1014 may each include one or more mixers, and filter circuitries 1008 and/or 1012 may each include one or more filters, such as one or more BPFs and/or LPFs according to application needs. For example, when mixer circuitries are of the direct-conversion type, they may each include two or more mixers.

In some embodiments, mixer circuitry 1002 may be configured to down-convert RF signals 907 received from the FEM circuitry 804a-b (FIG. 8) based on the synthesized frequency 1005 provided by synthesizer circuitry 1004. The amplifier circuitry 1006 may be configured to amplify the down-converted signals and the filter circuitry 1008 may include an LPF configured to remove unwanted signals from the down-converted signals to generate output baseband signals 1007. Output baseband signals 1007 may be provided to the baseband processing circuitry 808a-b (FIG. 8) for further processing. In some embodiments, the output baseband signals 1007 may be zero-frequency baseband signals, although this is not a requirement. In some embodiments, mixer circuitry 1002 may comprise passive mixers, although the scope of the embodiments is not limited in this respect.

In some embodiments, the mixer circuitry 1014 may be configured to up-convert input baseband signals 1011 based on the synthesized frequency 1005 provided by the synthesizer circuitry 1004 to generate RF output signals 909 for the FEM circuitry 804a-b. The baseband signals 1011 may be provided by the baseband processing circuitry 808a-b and may be filtered by filter circuitry 1012. The filter circuitry 1012 may include an LPF or a BPF, although the scope of the embodiments is not limited in this respect.

In some embodiments, the mixer circuitry 1002 and the mixer circuitry 1014 may each include two or more mixers and may be arranged for quadrature down-conversion and/or up-conversion respectively with the help of synthesizer 1004. In some embodiments, the mixer circuitry 1002 and the mixer circuitry 1014 may each include two or more mixers each configured for image rejection (e.g., Hartley image rejection). In some embodiments, the mixer circuitry 1002 and the mixer circuitry 1014 may be arranged for direct down-conversion and/or direct up-conversion, respectively. In some embodiments, the mixer circuitry 1002 and the mixer circuitry 1014 may be configured for super-heterodyne operation, although this is not a requirement.

Mixer circuitry 1002 may comprise, according to one embodiment: quadrature passive mixers (e.g., for the in-phase (I) and quadrature phase (Q) paths). In such an embodiment, RF input signal 907 from FIG. 10 may be down-converted to provide I and Q baseband output signals to be sent to the baseband processor.

Quadrature passive mixers may be driven by zero and ninety-degree time-varying LO switching signals provided by a quadrature circuitry which may be configured to receive a LO frequency (fLO) from a local oscillator or a synthesizer, such as LO frequency 1005 of synthesizer 1004 (FIG. 10). In some embodiments, the LO frequency may be the carrier frequency, while in other embodiments, the LO frequency may be a fraction of the carrier frequency (e.g., one-half the carrier frequency, one-third the carrier frequency). In some embodiments, the zero and ninety-degree time-varying switching signals may be generated by the synthesizer, although the scope of the embodiments is not limited in this respect.

In some embodiments, the LO signals may differ in duty cycle (the percentage of one period in which the LO signal is high) and/or offset (the difference between start points of the period). In some embodiments, the LO signals may have an 85% duty cycle and an 80% offset. In some embodiments, each branch of the mixer circuitry (e.g., the in-phase (I) and quadrature phase (Q) path) may operate at an 80% duty cycle, which may result in a significant reduction is power consumption.

The RF input signal 907 (FIG. 9) may comprise a balanced signal, although the scope of the embodiments is not limited in this respect. The I and Q baseband output signals may be provided to low-noise amplifier, such as amplifier circuitry 1006 (FIG. 10) or to filter circuitry 1008 (FIG. 10).

In some embodiments, the output baseband signals 1007 and the input baseband signals 1011 may be analog baseband signals, although the scope of the embodiments is not limited in this respect. In some alternate embodiments, the output baseband signals 1007 and the input baseband signals 1011 may be digital baseband signals. In these alternate embodiments, the radio IC circuitry may include analog-to-digital converter (ADC) and digital-to-analog converter (DAC) circuitry.

In some dual-mode embodiments, a separate radio IC circuitry may be provided for processing signals for each spectrum, or for other spectrums not mentioned here, although the scope of the embodiments is not limited in this respect.

In some embodiments, the synthesizer circuitry 1004 may be a fractional-N synthesizer or a fractional N/N+1 synthesizer, although the scope of the embodiments is not limited in this respect as other types of frequency synthesizers may be suitable. For example, synthesizer circuitry 1004 may be a delta-sigma synthesizer, a frequency multiplier, or a synthesizer comprising a phase-locked loop with a frequency divider. According to some embodiments, the synthesizer circuitry 1004 may include digital synthesizer circuitry. An advantage of using a digital synthesizer circuitry is that, although it may still include some analog components, its footprint may be scaled down much more than the footprint of an analog synthesizer circuitry. In some embodiments, frequency input into synthesizer circuitry 1004 may be provided by a voltage controlled oscillator (VCO), although that is not a requirement. A divider control input may further be provided by either the baseband processing circuitry 808*a*-*b* (FIG. 8) depending on the desired output frequency 1005. In some embodiments, a divider control input (e.g., N) may be determined from a look-up table (e.g., within a Wi-Fi card) based on a channel number and a channel center frequency as determined or indicated by the example application processor 810. The application processor 810 may include, or otherwise be connected to, one of the example secure signal converter 101 or the example received signal converter 103 (e.g., depending on which device the example radio architecture is implemented in).

In some embodiments, synthesizer circuitry 1004 may be configured to generate a carrier frequency as the output frequency 1005, while in other embodiments, the output frequency 1005 may be a fraction of the carrier frequency (e.g., one-half the carrier frequency, one-third the carrier frequency). In some embodiments, the output frequency 1005 may be a LO frequency (fLO).

Figure 11:
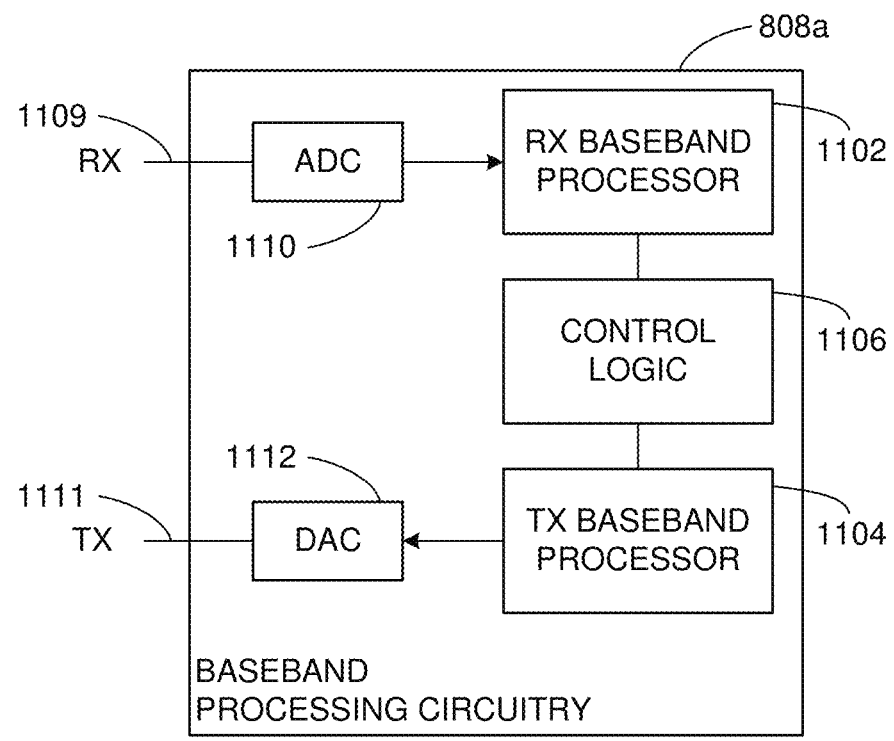
FIG. 11 illustrates an example baseband processing circuitry for use in the radio architecture of FIG. 8, in accordance with one or more example embodiments of the present disclosure.

FIG. 11 illustrates a functional block diagram of baseband processing circuitry 808*a* in accordance with some embodiments. The baseband processing circuitry 808*a* is one example of circuitry that may be suitable for use as the baseband processing circuitry 808*a* (FIG. 8), although other circuitry configurations may also be suitable. Alternatively, the example of FIG. 10 may be used to implement the example BT baseband processing circuitry 808*b* of FIG. 8.

The baseband processing circuitry 808*a* may include a receive baseband processor (RX BBP) 1102 for processing receive baseband signals 1009 provided by the radio IC circuitry 806*a*-*b* (FIG. 8) and a transmit baseband processor (TX BBP) 1104 for generating transmit baseband signals 1011 for the radio IC circuitry 806*a*-*b*. The baseband processing circuitry 808*a* may also include control logic 1106 for coordinating the operations of the baseband processing circuitry 808*a*.

In some embodiments (e.g., when analog baseband signals are exchanged between the baseband processing circuitry 808*a*-*b* and the radio IC circuitry 806*a*-*b*), the baseband processing circuitry 808*a* may include ADC 1110 to convert analog baseband signals 1109 received from the radio IC circuitry 806*a*-*b* to digital baseband signals for processing by the RX BBP 1102. In these embodiments, the baseband processing circuitry 808*a* may also include DAC 1112 to convert digital baseband signals from the TX BBP 1104 to analog baseband signals 1111.

In some embodiments that communicate OFDM signals or OFDMA signals, such as through baseband processor 808*a*, the transmit baseband processor 1104 may be configured to generate OFDM or OFDMA signals as appropriate for transmission by performing an inverse fast Fourier transform (IFFT). The receive baseband processor 1102 may be configured to process received OFDM signals or OFDMA signals by performing an FFT. In some embodiments, the receive baseband processor 1102 may be configured to detect the presence of an OFDM signal or OFDMA signal by performing an autocorrelation, to detect a preamble, such as a short preamble, and by performing a cross-correlation, to detect a long preamble. The preambles may be part of a predetermined frame structure for Wi-Fi communication.

Referring back to FIG. 8, in some embodiments, the antennas 801 (FIG. 8) may each comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result. Antennas 801 may each include a set of phased-array antennas, although embodiments are not so limited.

Although the radio architecture 105A, 105B is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

The word "exemplary" is used herein to mean "serving as an example, instance, or illustration." Any embodiment described herein as "exemplary" is not necessarily to be construed as preferred or advantageous over other embodiments. The terms "computing device," "user device," "communication station," "station," "handheld device," "mobile device," "wireless device" and "user equipment" (UE) as used herein refers to a wireless communication device such as a cellular telephone, a smartphone, a tablet, a netbook, a wireless terminal, a laptop computer, a femtocell, a high data rate (HDR) subscriber station, an access point, a printer, a point of sale device, an access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

The term "access point" (AP) as used herein may be a fixed station. An access point may also be referred to as an access node, a base station, an evolved node B (eNodeB), or some other similar terminology known in the art. An access terminal may also be called a mobile station, user equipment (UE), a wireless communication device, or some other similar terminology known in the art. Embodiments disclosed herein generally pertain to wireless networks. Some embodiments may relate to wireless networks that operate in accordance with one of the IEEE 802.11 standards.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

Some embodiments may be used in conjunction with one way and/or two-way radio communication systems, cellular radio-telephone communication systems, a mobile phone, a cellular telephone, a wireless telephone, a personal communication system (PCS) device, a PDA device which incorporates a wireless communication device, a mobile or portable global positioning system (GPS) device, a device which incorporates a GPS receiver or transceiver or chip, a device which incorporates an RFID element or chip, a multiple input multiple output (MIMO) transceiver or device, a single input multiple output (SIMO) transceiver or device, a multiple input single output (MISO) transceiver or device, a device having one or more internal antennas and/or external antennas, digital video broadcast (DVB) devices or systems, multi-standard radio devices or systems, a wired or wireless handheld device, e.g., a smartphone, a wireless application protocol (WAP) device, or the like.

Some embodiments may be used in conjunction with one or more types of wireless communication signals and/or systems following one or more wireless communication protocols, for example, radio frequency (RF), infrared (IR), frequency-division multiplexing (FDM), orthogonal FDM (OFDM), time-division multiplexing (TDM), time-division multiple access (TDMA), extended TDMA (E-TDMA), general packet radio service (GPRS), extended GPRS, code-division multiple access (CDMA), wideband CDMA (WCDMA), CDMA 2000, single-carrier CDMA, multi-carrier CDMA, multi-carrier modulation (MDM), discrete multi-tone (DMT), Bluetooth®, global positioning system (GPS), Wi-Fi, Wi-Max, ZigBee, ultra-wideband (UWB), global system for mobile communications (GSM), 2G, 2.5G, 3G, 3.5G, 4G, fifth generation (5G) mobile networks, 3GPP, long term evolution (LTE), LTE advanced, enhanced data rates for GSM Evolution (EDGE), or the like. Other embodiments may be used in various other devices, systems, and/or networks.

The following examples pertain to further embodiments.

Example 1 may include a device comprising processing circuitry coupled to storage, the processing circuitry configured to: generate a frame comprising a payload having a payload size associated with a number of bits; determine a low-density parity-check (LDPC) codeword size based on the payload size; calculate a number of codewords based on the payload size; calculate a number of shortening bits and a number of LDPC padding bits based on the number of codewords; calculate a number of orthogonal frequency division multiplexing (OFDM) symbols for containing the number of codewords; and cause to send the frame with the number of OFDM symbols to a station device.

Example 2 may include the device of example 1 and/or some other example herein, wherein the number of punctured bits may be equal to zero.

Example 3 may include the device of example 1 and/or some other example herein, wherein the number of shortening bits may be equal to zero by adding pre-FEC padding bits.

Example 4 may include the device of example 1 and/or some other example herein, wherein the LDPC padding bits are equal to a modulus of the number of shortening bits and the number of codeword.

Example 5 may include the device of example 1 and/or some other example herein, wherein the processing circuitry may be further configured to: determine a first criterion associated with occurrence of over-puncturing; and add a ¼ or ²⁄₄ or ¾ of an OFDM symbol when the first criterion may be true.

Example 6 may include the device of example 1 and/or some other example herein, wherein the processing circuitry may be further configured to: determine a first criterion associated with occurrence of over-puncturing; and add one or multiple OFDM symbols when the first criterion may be true.

Example 7 may include the device of example 1 and/or some other example herein, wherein the processing circuitry may be further configured to: determine a first criterion associated with occurrence of over-puncturing; and perform an iteration of adding a 1/4 of an OFDM symbol until the first criterion may be false.

Example 8 may include the device of example 1 and/or some other example herein, wherein the processing circuitry may be further configured to modify the first criterion to replace a determination requirement of whether a number of punctured bits may be greater than 30% of parity bits to be whether the number of punctured bits may be greater than 10% or 15% or 20% of parity bits.

Example 9 may include the device of example 1 and/or some other example herein, further comprising a transceiver configured to transmit and receive wireless signals.

Example 10 may include the device of example 9 and/or some other example herein, further comprising an antenna coupled to the transceiver to cause to send the frame.

Example 11 may include a non-transitory computer-readable medium storing computer-executable instructions which when executed by one or more processors result in performing operations comprising: generating a frame comprising a payload having a payload size associated with a number of bits; determining a low-density parity-check (LDPC) codeword size based on the payload size; calculating a number of codewords based on the payload size; calculating a number of shortening bits and a number of LDPC padding bits based on the number of codewords; calculating a number of orthogonal frequency division multiplexing (OFDM) symbols for containing the number of codewords; and causing to send the frame with the number of OFDM symbols to a station device.

Example 12 may include the non-transitory computer-readable medium of example 11 and/or some other example herein, wherein the number of punctured bits may be equal to zero.

Example 13 may include the non-transitory computer-readable medium of example 11 and/or some other example herein, wherein the number of shortening bits may be equal to zero by adding pre-FEC padding bits.

Example 14 may include the non-transitory computer-readable medium of example 11 and/or some other example herein, wherein the LDPC padding bits are equal to a modulus of the number of shortening bits and the number of codeword.

Example 15 may include the non-transitory computer-readable medium of example 11 and/or some other example herein, wherein the operations further comprise: determining a first criterion associated with occurrence of over-puncturing; and add a ¼ or ²⁄₄ or ¾ of an OFDM symbol when the first criterion may be true.

Example 16 may include the non-transitory computer-readable medium of example 11 and/or some other example herein, wherein the operations further comprise: determining a first criterion associated with occurrence of over-puncturing; and add one or multiple OFDM symbols when the first criterion may be true.

Example 17 may include the non-transitory computer-readable medium of example 11 and/or some other example herein, wherein the operations further comprise: determining a first criterion associated with occurrence of over-puncturing; and performing an iteration of adding a ¼ of an OFDM symbol until the first criterion may be false.

Example 18 may include the non-transitory computer-readable medium of example 11 and/or some other example herein, wherein the operations further comprise modifying the first criterion to replace a determination requirement of whether a number of punctured bits may be greater than 30% of parity bits to be whether the number of punctured bits may be greater than 10% or 15% or 20% of parity bits.

Example 19 may include a method comprising: generating, by one or more processors, a frame comprising a payload having a payload size associated with a number of bits; determining a low-density parity-check (LDPC) codeword size based on the payload size; calculating a number of codewords based on the payload size; calculating a number of shortening bits and a number of LDPC padding bits based on the number of codewords; calculating a number of orthogonal frequency division multiplexing (OFDM) symbols for containing the number of codewords; and causing to send the frame with the number of OFDM symbols to a station device.

Example 20 may include the method of example 19 and/or some other example herein, wherein the number of punctured bits may be equal to zero.

Example 21 may include the method of example 19 and/or some other example herein, wherein the number of shortening bits may be equal to zero by adding pre-FEC padding bits.

Example 22 may include the method of example 19 and/or some other example herein, wherein the LDPC padding bits are equal to a modulus of the number of shortening bits and the number of codeword.

Example 23 may include the method of example 19 and/or some other example herein, further comprising: determining a first criterion associated with occurrence of over-puncturing; and add a ¼ or ²⁄₄ or ¾ of an OFDM symbol when the first criterion may be true.

Example 24 may include the method of example 19 and/or some other example herein, further comprising: determining a first criterion associated with occurrence of over-puncturing; and add one or multiple OFDM symbols when the first criterion may be true.

Example 25 may include the method of example 19 and/or some other example herein, further comprising: determining a first criterion associated with occurrence of over-puncturing; and performing an iteration of adding a ¼ of an OFDM symbol until the first criterion may be false.

Example 26 may include the method of example 19 and/or some other example herein, further comprising modifying the first criterion to replace a determination requirement of whether a number of punctured bits may be greater than 30% of parity bits to be whether the number of punctured bits may be greater than 10% or 15% or 20% of parity bits.

Example 27 may include an apparatus comprising means for: generating a frame comprising a payload having a payload size associated with a number of bits; determining a low-density parity-check (LDPC) codeword size based on the payload size; calculating a number of codewords based on the payload size; calculating a number of shortening bits and a number of LDPC padding bits based on the number of codewords; calculating a number of orthogonal frequency division multiplexing (OFDM) symbols for containing the number of codewords; and causing to send the frame with the number of OFDM symbols to a station device.

Example 28 may include the apparatus of example 27 and/or some other example herein, wherein the number of punctured bits may be equal to zero.

Example 29 may include the apparatus of example 27 and/or some other example herein, wherein the number of shortening bits may be equal to zero by adding pre-FEC padding bits.

Example 30 may include the apparatus of example 27 and/or some other example herein, wherein the LDPC padding bits are equal to a modulus of the number of shortening bits and the number of codeword.

Example 31 may include the apparatus of example 27 and/or some other example herein, further comprising: determining a first criterion associated with occurrence of over-puncturing; and add a ¼ or ²⁄₄ or ¾ of an OFDM symbol when the first criterion may be true.

Example 32 may include the apparatus of example 27 and/or some other example herein, further comprising: determining a first criterion associated with occurrence of over-puncturing; and add one or multiple OFDM symbols when the first criterion may be true.

Example 33 may include the apparatus of example 27 and/or some other example herein, further comprising: determining a first criterion associated with occurrence of over-puncturing; and performing an iteration of adding a ¼ of an OFDM symbol until the first criterion may be false.

Example 34 may include the apparatus of example 27 and/or some other example herein, further comprising modifying the first criterion to replace a determination requirement of whether a number of punctured bits may be greater than 30% of parity bits to be whether the number of punctured bits may be greater than 10% or 15% or 20% of parity bits.

Example 35 may include one or more non-transitory computer-readable media comprising instructions to cause an electronic device, upon execution of the instructions by one or more processors of the electronic device, to perform one or more elements of a method described in or related to any of examples 1-34, or any other method or process described herein.

Example 36 may include an apparatus comprising logic, modules, and/or circuitry to perform one or more elements of a method described in or related to any of examples 1-34, or any other method or process described herein.

Example 37 may include a method, technique, or process as described in or related to any of examples 1-34, or portions or parts thereof.

Example 38 may include an apparatus comprising: one or more processors and one or more computer readable media comprising instructions that, when executed by the one or more processors, cause the one or more processors to perform the method, techniques, or process as described in or related to any of examples 1-34, or portions thereof.

Example 39 may include a method of communicating in a wireless network as shown and described herein.

Example 40 may include a system for providing wireless communication as shown and described herein.

Example 41 may include a device for providing wireless communication as shown and described herein.

Embodiments according to the disclosure are in particular disclosed in the attached claims directed to a method, a storage medium, a device and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

The foregoing description of one or more implementations provides illustration and description, but is not intended to be exhaustive or to limit the scope of embodiments to the precise form disclosed. Modifications and variations are possible in light of the above teachings or may be acquired from practice of various embodiments.

Certain aspects of the disclosure are described above with reference to block and flow diagrams of systems, methods, apparatuses, and/or computer program products according to various implementations. It will be understood that one or more blocks of the block diagrams and flow diagrams, and combinations of blocks in the block diagrams and the flow diagrams, respectively, may be implemented by computer-executable program instructions. Likewise, some blocks of the block diagrams and flow diagrams may not necessarily need to be performed in the order presented, or may not necessarily need to be performed at all, according to some implementations.

These computer-executable program instructions may be loaded onto a special-purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable storage media or memory that may direct a computer or other programmable data processing apparatus to function in a particular manner, such that the instructions stored in the computer-readable storage media produce an article of manufacture including instruction means that implement one or more functions specified in the flow diagram block or blocks. As an example, certain implementations may provide for a computer program product, comprising a computer-readable storage medium having a computer-readable program code or program instructions implemented therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. A device, the device comprising processing circuitry coupled to storage, the processing circuitry configured to:
    generate a frame comprising a payload having a payload size associated with a number of bits;
    determine a low-density parity-check (LDPC) codeword size based on the payload size;
    calculate a number of codewords based on the payload size;
    calculate a number of shortening bits and a number of LDPC padding bits based on the number of codewords;
    calculate a number of orthogonal frequency division multiplexing (OFDM) symbols for containing the number of codewords; and
    cause to send the frame with the number of OFDM symbols to a station device.

2. The device of claim 1, wherein the number of punctured bits is equal to zero.

3. The device of claim 1, wherein the number of shortening bits is equal to zero by adding pre-FEC padding bits.

4. The device of claim 1, wherein the LDPC padding bits are equal to a modulus of the number of shortening bits and the number of codeword.

5. The device of claim 1, wherein the processing circuitry is further configured to:
    determine a first criterion associated with occurrence of over-puncturing; and
    add a ¼ or ²⁄₄ or ¾ of an OFDM symbol when the first criterion is true.

6. The device of claim 1, wherein the processing circuitry is further configured to:
    determine a first criterion associated with occurrence of over-puncturing; and
    add one or multiple OFDM symbols when the first criterion is true.

7. The device of claim 1, wherein the processing circuitry is further configured to:
    determine a first criterion associated with occurrence of over-puncturing; and
    perform an iteration of adding a ¼ of an OFDM symbol until the first criterion is false.

8. The device of claim 1, wherein the processing circuitry is further configured to modify the first criterion to replace a determination requirement of whether a number of punctured bits is greater than 30% of parity bits to be whether the number of punctured bits is greater than 10% or 15% or 20% of parity bits.

9. The device of claim 1, further comprising a transceiver configured to transmit and receive wireless signals.

10. The device of claim 9, further comprising an antenna coupled to the transceiver to cause to send the frame.

11. A non-transitory computer-readable medium storing computer-executable instructions which when executed by one or more processors result in performing operations comprising:
    generating a frame comprising a payload having a payload size associated with a number of bits;
    determining a low-density parity-check (LDPC) codeword size based on the payload size;
    calculating a number of codewords based on the payload size;
    calculating a number of shortening bits and a number of LDPC padding bits based on the number of codewords;
    calculating a number of orthogonal frequency division multiplexing (OFDM) symbols for containing the number of codewords; and
    causing to send the frame with the number of OFDM symbols to a station device.

12. The non-transitory computer-readable medium of claim 11, wherein the number of punctured bits is equal to zero.

13. The non-transitory computer-readable medium of claim 11, wherein the number of shortening bits is equal to zero by adding pre-FEC padding bits.

14. The non-transitory computer-readable medium of claim 11, wherein the LDPC padding bits are equal to a modulus of the number of shortening bits and the number of codeword.

15. The non-transitory computer-readable medium of claim 11, wherein the operations further comprise:
    determining a first criterion associated with occurrence of over-puncturing; and
    add a ¼ or ²⁄₄ or ¾ of an OFDM symbol when the first criterion is true.

16. The non-transitory computer-readable medium of claim 11, wherein the operations further comprise:
    determining a first criterion associated with occurrence of over-puncturing; and
    add one or multiple OFDM symbols when the first criterion is true.

17. The non-transitory computer-readable medium of claim 11, wherein the operations further comprise:
    determining a first criterion associated with occurrence of over-puncturing; and performing an iteration of adding a ¼ of an OFDM symbol until the first criterion is false.

18. The non-transitory computer-readable medium of claim 11, wherein the operations further comprise modifying the first criterion to replace a determination requirement of whether a number of punctured bits is greater than 30% of parity bits to be whether the number of punctured bits is greater than 10% or 15% or 20% of parity bits.

19. A method comprising:
- generating, by one or more processors, a frame comprising a payload having a payload size associated with a number of bits;
- determining a low-density parity-check (LDPC) codeword size based on the payload size;
- calculating a number of codewords based on the payload size;
- calculating a number of shortening bits and a number of LDPC padding bits based on the number of codewords;
- calculating a number of orthogonal frequency division multiplexing (OFDM) symbols for containing the number of codewords; and
- causing to send the frame with the number of OFDM symbols to a station device.

20. The method of claim 19, wherein the number of punctured bits is equal to zero.

* * * * *